(12) United States Patent
Lee et al.

(10) Patent No.: US 11,730,022 B2
(45) Date of Patent: Aug. 15, 2023

(54) DISPLAY DEVICE INCLUDING A SIDEWALL HAVING AN INCLINATION ANGLE AND METHOD OF MANUFACTURING THE SAME

(71) Applicant: Samsung Display Co., Ltd., Yongin-si (KR)

(72) Inventors: Jongchan Lee, Yongin-si (KR); Taehee Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 182 days.

(21) Appl. No.: 16/943,744

(22) Filed: Jul. 30, 2020

(65) Prior Publication Data

US 2021/0249490 A1    Aug. 12, 2021

(30) Foreign Application Priority Data

Feb. 10, 2020 (KR) .......................... 10-2020-0015839

(51) Int. Cl.
*H10K 59/124* (2023.01)
*H10K 59/122* (2023.01)
*H10K 59/123* (2023.01)
*H10K 59/121* (2023.01)
*H10K 59/12* (2023.01)

(52) U.S. Cl.
CPC ......... *H10K 59/124* (2023.02); *H10K 59/122* (2023.02); *H10K 59/123* (2023.02); *H10K 59/1216* (2023.02); *H10K 59/1201* (2023.02)

(58) Field of Classification Search
CPC ............ H01L 27/3258; H01L 27/3246; H01L 27/3248; H01L 27/3265; H01L 2227/323

USPC .......................................................... 257/91
See application file for complete search history.

(56) References Cited

U.S. PATENT DOCUMENTS

| 9,601,717 B2 | 3/2017 | Lee et al. |
| 10,263,217 B2 | 4/2019 | Lee et al. |
| 10,388,794 B2 | 8/2019 | Lee et al. |
| 2015/0228700 A1* | 8/2015 | Cho ................... H01L 27/3248 257/40 |
| 2018/0090702 A1* | 3/2018 | Um ...................... H01L 51/5253 |
| 2018/0190730 A1* | 7/2018 | Cho ................... H01L 51/5262 |
| 2019/0207157 A1 | 7/2019 | Gong et al. |
| 2020/0136068 A1* | 4/2020 | Lee ........................ H01L 51/56 |

FOREIGN PATENT DOCUMENTS

| KR | 10-2017-0049146 A | 5/2017 |
| KR | 10-1926582 B1 | 12/2018 |
| KR | 10-2019-0081005 A | 7/2019 |

* cited by examiner

*Primary Examiner* — Xia L Cross
(74) *Attorney, Agent, or Firm* — Lewis Roca Rothgerber Christie LLP

(57) ABSTRACT

A display device includes a substrate including a pixel area and a transmission area; a plurality of insulating layers on the pixel area and the transmission area; a first conductive layer on the plurality of insulating layers of the pixel area, the first conductive layer including a first sidewall having a first inclination angle and a second sidewall having a second inclination angle different from the first inclination angle; a first spacer located on a same layer as the first conductive layer, the first spacer being at a boundary between the pixel area and the transmission area and extending to the pixel area and the transmission area; and a first planarization layer on the first conductive layer.

20 Claims, 14 Drawing Sheets

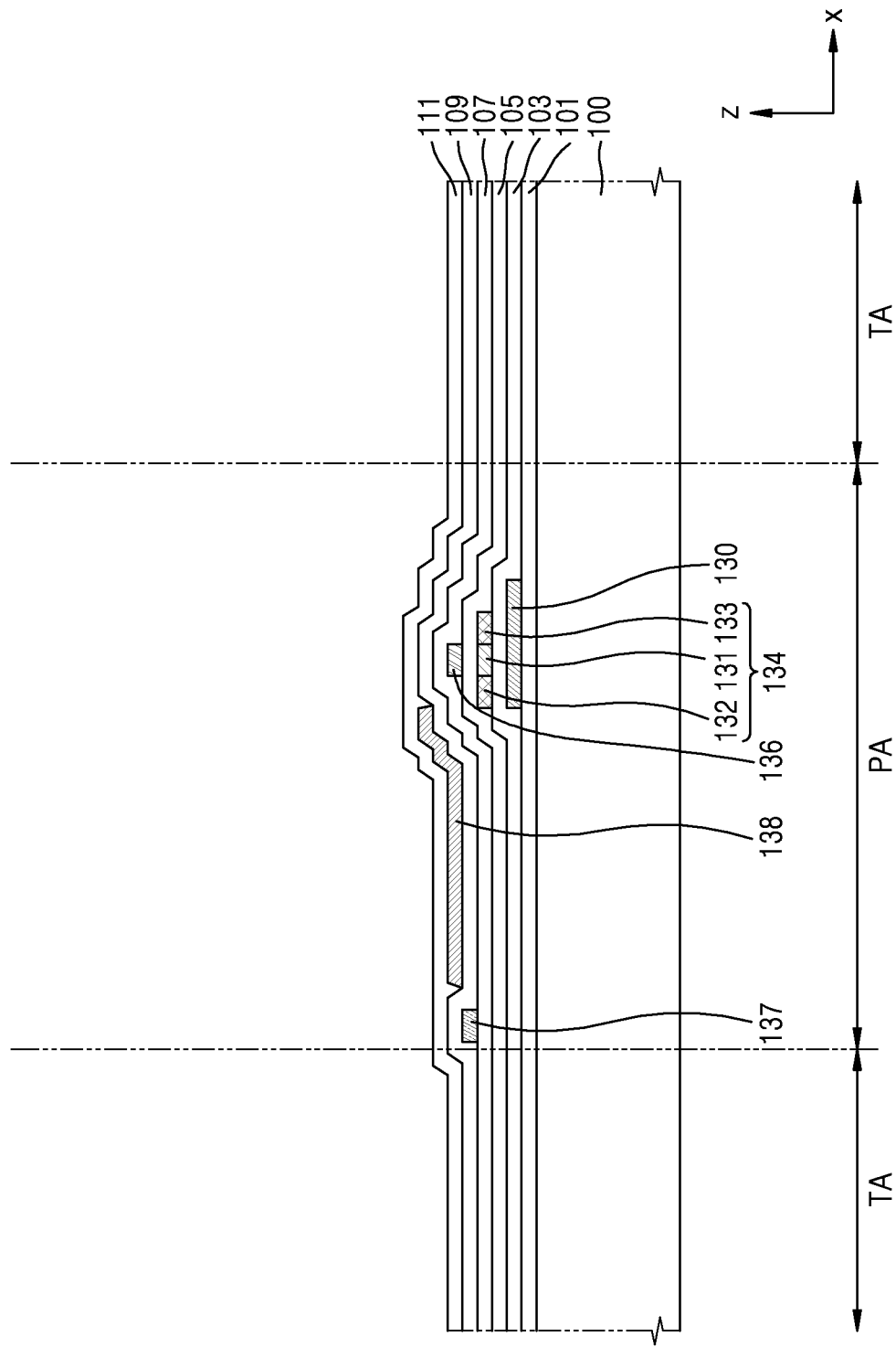

DISPLAY DEVICE INCLUDING A SIDEWALL HAVING AN INCLINATION ANGLE AND METHOD OF MANUFACTURING THE SAME

CROSS-REFERENCE TO RELATED APPLICATION

This application claims priority to and the benefit of Korean Patent Application No. 10-2020-0015839, filed on Feb. 10, 2020, in the Korean Intellectual Property Office (KIPO), the entire disclosure of which is incorporated herein by reference.

BACKGROUND

1. Field

One or more embodiments relate to a display device and a method of manufacturing the display device, and more particularly, to a display device having improved reliability and a method of manufacturing the display device.

2. Description of Related Art

In recent years, display devices have been used in a variety of applications. Because the display devices have become thinner and lighter, the range of potential uses for display devices is increasing.

For example, a display device may be used as a display unit of a small product (e.g., a mobile phone), or may be used as a display unit of a large product (e.g., a television). Further, the display device may be used in various ways (e.g., a display device may be applied to a head up display (HUD) of an automobile or an electronic device for artificial intelligence (AI)). Therefore, depending on application methods, a transparent display device having a property of transmitting light may be desirable.

SUMMARY

In a related art display device, when the size of a transmission area is increased to improve the transmittance of the display device, an organic material forming a planarization layer in a pixel area may be lost due to a difference in height between layers arranged on the pixel area and the transmission area.

Aspects of one or more embodiments are directed to a display device that prevents or reduces loss of organic material and has high transmittance. However, this is merely an example and the scope of the present disclosure is not limited thereby.

Additional aspects will be set forth in part in the description which follows and, in part, will be apparent from the description, or may be learned by practice of the presented embodiments of the present disclosure.

According to one or more embodiments, a display device includes a substrate including a pixel area and a transmission area, a plurality of insulating layers on the pixel area and the transmission area, a first conductive layer on the plurality of insulating layers of the pixel area, the first conductive layer including a first sidewall having a first inclination angle and a second sidewall having a second inclination angle different from the first inclination angle, a first spacer located on the same layer as the first conductive layer, the first spacer being at a boundary between the pixel area and the transmission area and extending to the pixel area and the transmission area, and a first planarization layer on the first conductive layer.

The first inclination angle may be 70 degrees or more and 90 degrees or less, and the second inclination angle may be less than 70 degrees.

The first spacer may be in direct contact with the first sidewall of the first conductive layer.

The display device may further include: a second conductive layer on the plurality of insulating layers of the pixel area, the second conductive layer including a third sidewall having a third inclination angle and a fourth sidewall having a fourth inclination angle different from the third inclination angle.

The third inclination angle may be less than 70 degrees, and the fourth inclination angle may be 70 degrees or more and 90 degrees or less.

The display device may further include a second spacer located on the same layer as the second conductive layer, the second spacer being at a boundary between the pixel area and the transmission area and extending to the pixel area and the transmission area.

The second spacer may be in direct contact with the fourth sidewall of the second conductive layer.

The first spacer and the second spacer may be on the same layer.

The first planarization layer may be located inside the first spacer and the second spacer.

The plurality of insulating layers may include a first insulating layer on the substrate, a second insulating layer on the first insulating layer, a third insulating layer on the second insulating layer, a fourth insulating layer on the third insulating layer, and a fifth insulating layer on the fourth insulating layer.

The first spacer may have a first height from a top surface of the fifth insulating layer and the first conductive layer may have a second height from the top surface of the fifth insulating layer, wherein the first height and the second height may be substantially equal to each other.

The display device may further include a second planarization layer on the first planarization layer, a pixel electrode on the second planarization layer, a pixel-defining layer on the pixel electrode to expose at least a portion of the pixel electrode, an intermediate layer on the pixel electrode, and an opposite electrode on the intermediate layer.

At least a portion of the opposite electrode may extend to the transmission area.

The pixel area may have a first transmittance, and the transmission area may have a second transmittance greater than the first transmittance.

According to one or more embodiments, a method of manufacturing a display device includes preparing a substrate including a pixel area and a transmission area, forming a plurality of insulating layers on the pixel area and the transmission area, forming a first conductive layer and a second conductive layer on the plurality of insulating layers of the pixel area, the first conductive layer including a first sidewall having a first inclination angle and a second sidewall having a second inclination angle different from the first inclination angle, and the second conductive layer including a third sidewall having a third inclination angle and a fourth sidewall having a fourth inclination angle different from the third inclination angle, forming an inorganic layer on the first conductive layer and the second conductive layer, and forming a first spacer and a second spacer by etching the inorganic layer.

The first conductive layer, the second conductive layer, the first spacer, and the second spacer may be located on the same layer.

The first spacer may be in direct contact with the first sidewall of the first conductive layer, and the second spacer may be in direct contact with the fourth sidewall of the second conductive layer.

The first inclination angle and the fourth inclination angle may be 70 degrees or more and 90 degrees or less, and the second inclination angle and the third inclination angle may be less than 70 degrees.

Each of the first spacer and the second spacer may be arranged at a boundary between the pixel area and the transmission area and extend to the pixel area and the transmission area.

The method may further include after the forming the first spacer and the second spacer, forming a first planarization layer on the first conductive layer, wherein the first planarization layer is located inside the first spacer and the second spacer.

Other aspects, features, and advantages than the above-described aspects, features, and advantages will be apparent from a detailed description, the claims, and the drawings.

BRIEF DESCRIPTION OF THE DRAWINGS

The above and other aspects, features, and advantages of certain embodiments of the present disclosure will be more apparent from the following description taken in conjunction with the accompanying drawings, in which:

FIGS. 10A-10F are schematic cross-sectional views illustrating a process of manufacturing a display device according to an embodiment.

DETAILED DESCRIPTION

Figure 1:
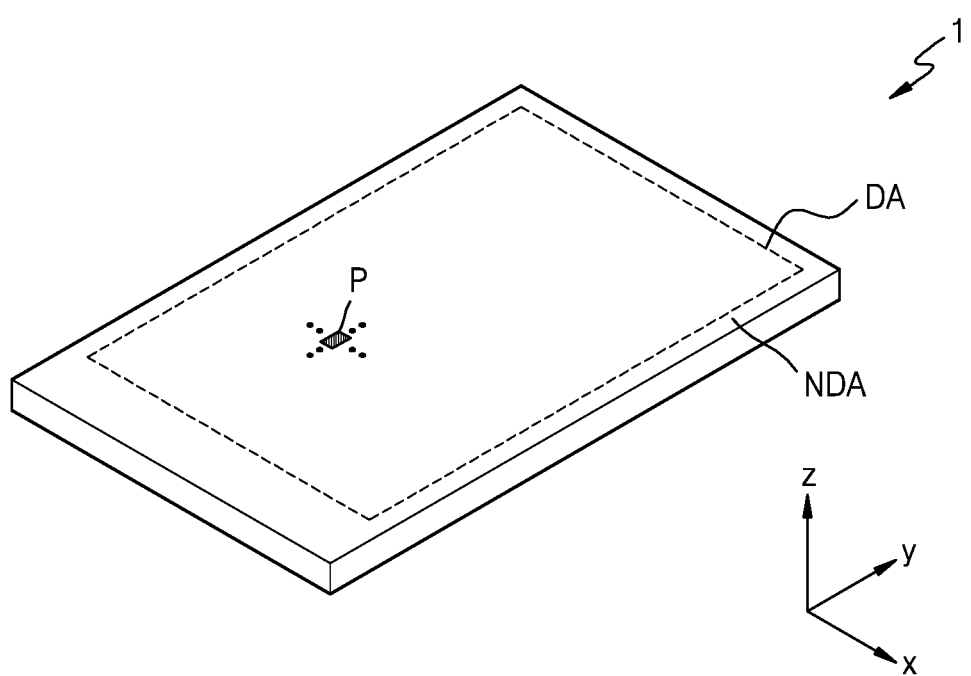
FIG. 1 is a schematic perspective view of a display device according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the drawings, to explain aspects of the present description. As used herein, the term "and/or" includes any and all combinations of one or more of the associated listed items. Throughout the present disclosure, the expression "at least one of a, b or c" indicates only a, only b, only c, both a and b, both a and c, both b and c, all of a, b, and c, or variations thereof.

It will be understood that although terms such as "first" and "second" may be used herein to describe various components, these components should not be limited by these terms and these terms are only used to distinguish one component from another component. Also, as used herein, the singular forms "a," "an," and "the" are intended to include the plural forms as well, unless the context clearly indicates otherwise.

Also, it will be understood that the terms "comprise," "include," and "have" used herein specify the presence of stated features or components, but do not preclude the presence or addition of one or more other features or components. Also, it will be understood that when a layer, region, or component is referred to as being "located on" another layer, region, or component, it may be "directly" or "indirectly" located on the other layer, region, or component, that is, for example, one or more intervening layers, regions, or components may be located therebetween.

As used herein, the term "and/or" includes any and all combinations of one or more of the associated listed items.

Further, the use of "may" when describing embodiments of the present disclosure refers to "one or more embodiments of the present disclosure".

Sizes of components in the drawings may be exaggerated for convenience of description. In other words, because the sizes and thicknesses of components in the drawings are arbitrarily illustrated for convenience of description, the present disclosure is not limited thereto.

The x-axis, the y-axis, and the z-axis are not limited to three axes of the rectangular coordinate system and may be interpreted in a broader sense. For example, the x-axis, the y-axis, and the z-axis may be perpendicular to each other, or may represent different directions that are not perpendicular to each other.

As used herein, "a plan view" may refer to a view from top or from a direction normal to the display area of the display device.

Spatially relative terms, such as "beneath," "below," "lower," "above," "upper," "bottom," "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially", "about", and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

When a certain embodiment may be implemented differently, a particular process order may be performed differently from the described order. For example, two consecutively described processes may be performed substantially at the same time or performed in an order opposite to the described order.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic perspective view of a display device 1 according to an embodiment.

Referring to FIG. 1, the display device 1 may include a display area DA and a non-display area NDA arranged around the display area DA. The non-display area NDA may surround the display area DA. The display device 1 may provide an image by using light emitted from a plurality of pixels P arranged in the display area DA, and the non-display area NDA may be an area where no image is displayed or provided.

Hereinafter, although an organic light-emitting display device is described as an example of the display device 1 according to an embodiment, the display device of the present disclosure is not limited thereto. In one or more embodiments, the display device 1 of the present disclosure may be an inorganic light-emitting display device (or an inorganic electroluminescence (EL) display device) or may be a display device such as a quantum dot light-emitting display device. For example, an emission layer of a display element included in the display device 1 may include an organic material, an inorganic material, quantum dots, an organic material and quantum dots, or an inorganic material and quantum dots.

Although FIG. 1 illustrates the display device 1 having a flat display surface, the present disclosure is not limited thereto. In one or more embodiments, the display device 1 may include a three-dimensional display surface or a curved display surface.

When the display device 1 includes a three-dimensional display surface, the display device 1 may include a plurality of display areas indicating (e.g., directed toward) different directions and may include, for example, a polygonal columnar display surface. In one or more embodiments, when the display device 1 includes a curved display surface, the display device 1 may be implemented in various suitable forms (e.g., flexible, foldable, and/or rollable forms for display devices).

FIG. 1 illustrates the display device 1 that may be applied to a mobile phone terminal. In one or more embodiments, a mobile phone terminal may be constructed by arranging electronic modules, a camera module, a power module, and the like mounted on a main board, together with the display device 1 in a bracket/case or the like. The display device 1 according to the present disclosure may be applied to large electronic apparatuses (e.g., televisions or monitors) and small and medium electronic apparatuses (e.g., tablets, car navigations, game machines, or smart watches).

Although FIG. 1 illustrates a case where the display area DA of the display device 1 is tetragonal, the shape of the display area DA may also be circular, elliptical, or polygonal (e.g., triangular or pentagonal).

Figure 2:
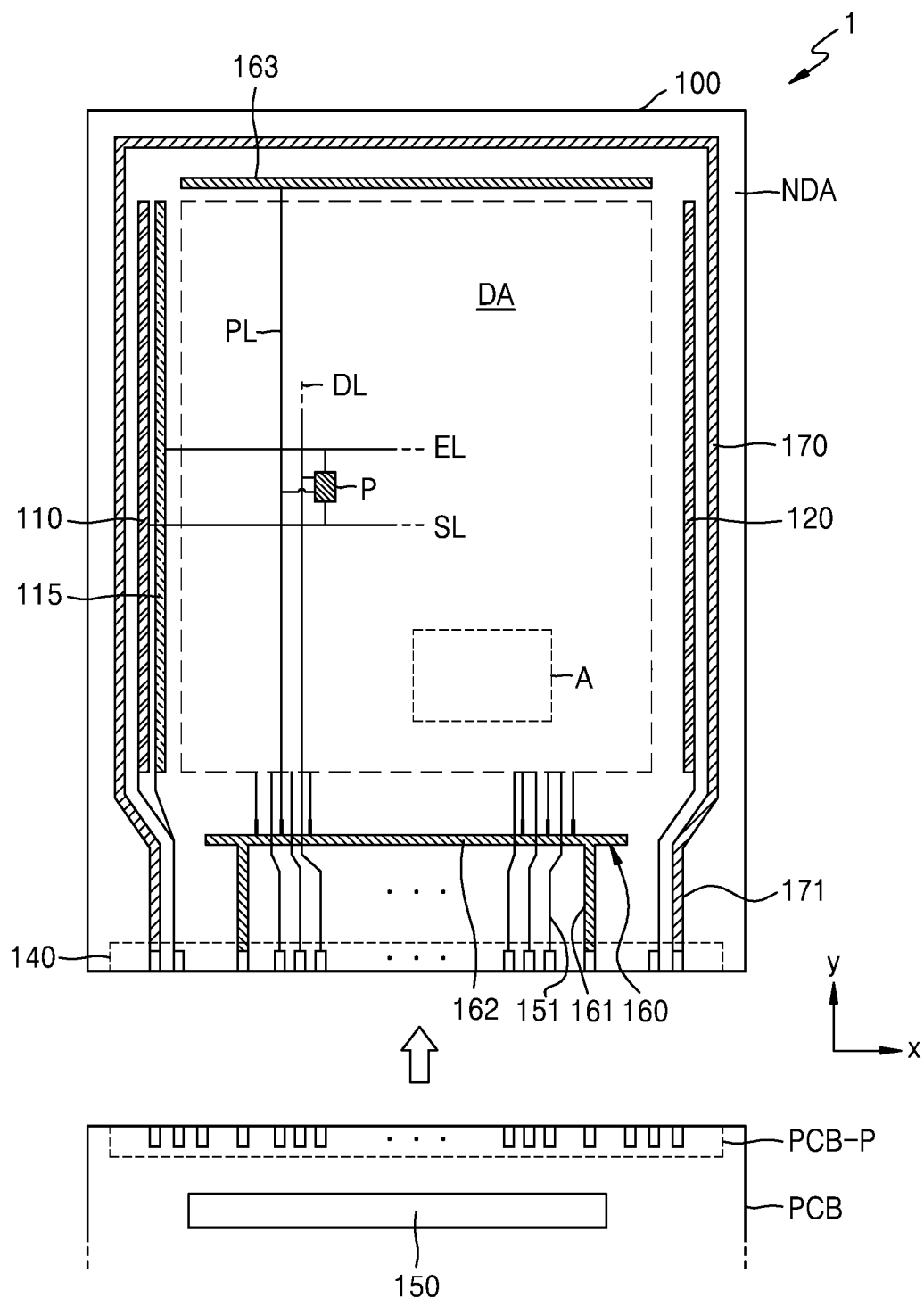
FIG. 2 is a schematic plan view of a portion of a display device according to an embodiment.

FIG. 2 is a schematic plan view of a portion of a display device 1 according to an embodiment.

Referring to FIG. 2, the display device 1 may include a plurality of pixels P arranged in a display area DA. Each of the plurality of pixels P may include a display element (e.g., an organic light-emitting diode OLED). Each of the plurality of pixels P may emit light (e.g., red, green, blue, or white light) from the organic light-emitting diode OLED. The pixel P used herein refers to a pixel that emits one of red, green, blue, or white light, as described above.

Each pixel P may be connected (e.g., electrically connected) to outer circuits arranged in the non-display area NDA. A first scan driving circuit 110, a first emission driving circuit 115, a second scan driving circuit 120, a terminal 140, a data driving circuit 150, a first power supply line 160, and a second power supply line 170 may be arranged in the non-display area NDA.

The first scan driving circuit 110 may provide a scan signal to each pixel P via a scan line SL. The first emission driving circuit 115 may provide an emission control signal to each pixel P via an emission control line EL. The second scan driving circuit 120 may be arranged parallel to the first scan driving circuit 110 with the display area DA therebetween. Some of the pixels P arranged in the display area DA may be connected (e.g., electrically connected) to the first scan driving circuit 110, and other ones of the pixels P (e.g., the rest thereof) may be connected (e.g., electrically connected) to the second scan driving circuit 120. In one or more embodiments, a second emission driving circuit may be arranged parallel to the first emission driving circuit 115 with the display area DA therebetween.

The first emission driving circuit 115 may be apart from the first scan driving circuit 110 in an x-direction and arranged in the non-display area NDA. In one or more embodiments, the first emission driving circuit 115 may be arranged alternately with the first scan driving circuit 110 in a y-direction.

The terminal 140 may be arranged on or at one side of a substrate 100. The terminal 140 may not be covered by an insulating layer but may be exposed and thus may be connected (e.g., electrically connected) to a printed circuit board PCB. A terminal PCB-P of the printed circuit board PCB may be connected (e.g., electrically connected) to the terminal 140 of the display device 1. The printed circuit board PCB is configured to provide signals or power of a controller to the display device 1. Control signals generated by the controller may be provided to each of the first scan driving circuit 110, the second scan driving circuit 120, and the first emission driving circuit 115 through the printed circuit board PCB. The controller may provide a power supply voltage to the first power supply line 160 and the second power supply line 170 via a first connection line 161 and a second connection line 171, respectively. A first power supply voltage ELVDD may be provided to the pixel P via a driving voltage line PL connected to the first power supply line 160, and a second power supply voltage ELVSS may be provided to an opposite electrode of the pixel P connected to the second power supply line 170.

A data driving circuit 150 is connected (e.g., electrically connected) to a data line DL. Data signals of the data driving circuit 150 may be provided to each pixel P via a connection line 151 connected to the terminal 140 and the data line DL connected to the connection line 151.

FIG. 2 illustrates that the data driving circuit 150 is arranged on the printed circuit board PCB. However, in one or more embodiments, the data driving circuit 150 may be arranged on the substrate 100. For example, the data driving circuit 150 may be arranged between the terminal 140 and the first power supply line 160.

The first power supply line 160 may include a first sub-line 162 and a second sub-line 163, which extend parallel to each other in the x-direction with the display area DA therebetween. The second power supply line 170 may surround the display area DA partially. For example, the second power supply line 170 may have a shape of a loop with one open side. In one or more embodiments, the display area DA may be at the center of the loop.

Figure 3:
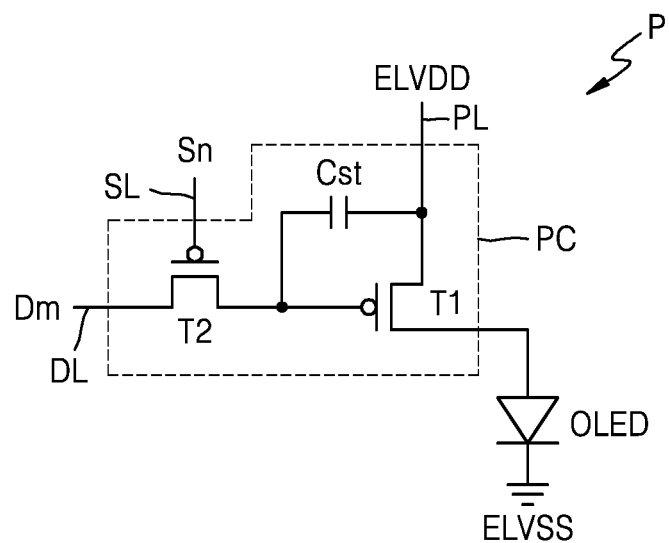
FIG. 3 is an equivalent circuit diagram of a pixel that may be included in a display device according to an embodiment.

FIG. 3 is an equivalent circuit diagram of a pixel that may be included in a display device according to an embodiment.

Referring to FIG. 3, each pixel P includes a pixel circuit PC connected to a scan line SL and a data line DL and an organic light-emitting diode OLED connected to the pixel circuit PC.

The pixel circuit PC includes a driving thin film transistor T1, a switching thin film transistor T2, and a storage capacitor Cst. The switching thin film transistor T2 is connected to the scan line SL and the data line DL and is configured to provide a data signal Dm, which is input via the data line DL according to a scan signal Sn input via the scan line SL, to the driving thin film transistor T1.

The storage capacitor Cst is connected to the switching thin film transistor T2 and a driving voltage line PL and stores a voltage corresponding to a difference between the voltage received from the switching thin film transistor T2 and the first power supply voltage ELVDD (or a driving voltage) supplied to the driving voltage line PL.

The driving thin film transistor T1 may be connected to the driving voltage line PL and the storage capacitor Cst and may control a driving current that flows through the organic light-emitting diode OLED from the driving voltage line PL in correspondence with a voltage value stored in the storage capacitor Cst. The organic light-emitting diode OLED may emit light with certain brightness according to the driving current.

In FIG. 3, the pixel circuit PC includes two thin film transistors and one storage capacitor. However, the present disclosure is not limited thereto. In one or more embodiments, the pixel circuit PC may be modified in various ways with suitable changes, including seven thin film transistors and one storage capacitor, or three thin film transistors and two storage capacitors.

Figure 4:
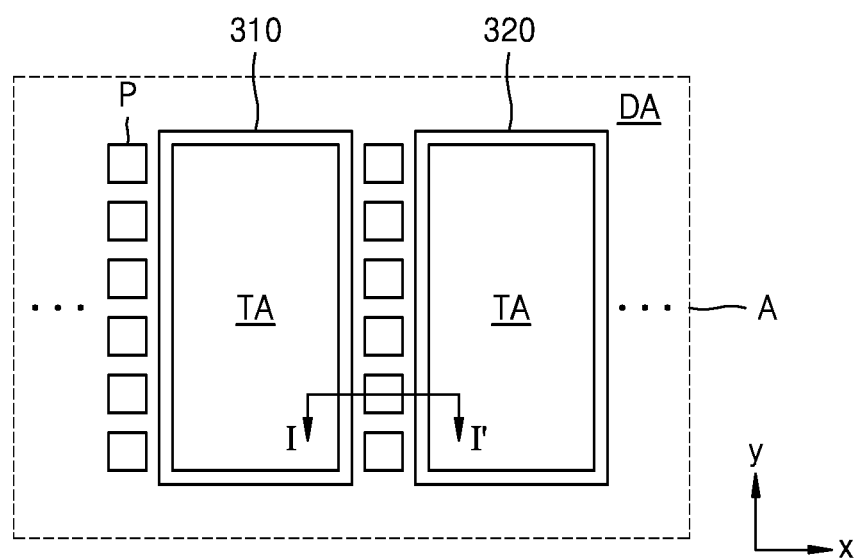
FIG. 4 is a schematic plan view of a display device according to an embodiment.
Figure 5:
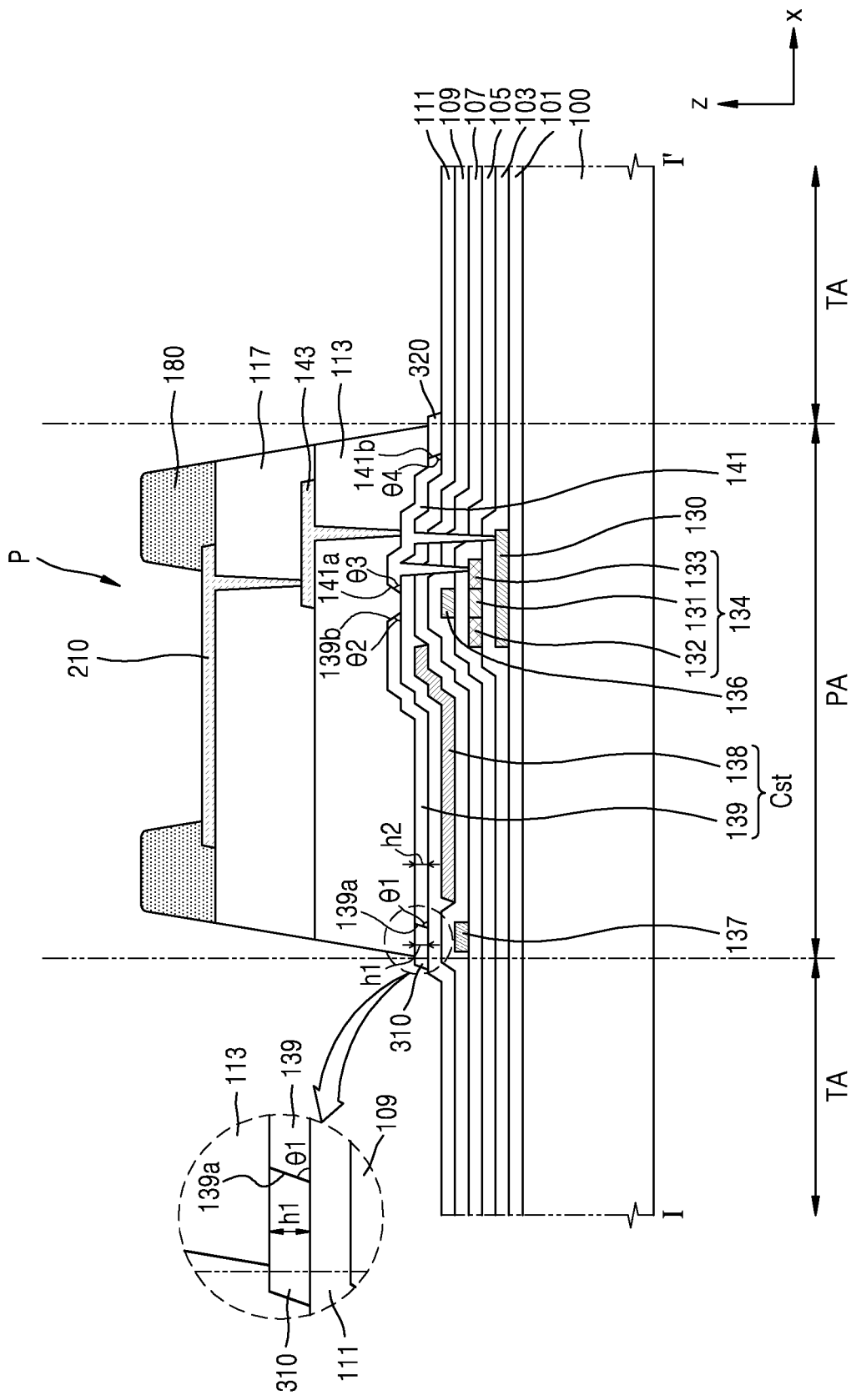
FIG. 5 is a schematic cross-sectional view of a display device taken along the line I-I' according to an embodiment.

FIG. 4 is a schematic plan view of a display device according to an embodiment, and FIG. 5 is a schematic cross-sectional view of a display device taken along the line I-I' according to an embodiment.

More specifically, FIG. 4 is an enlarged view of a region A of FIG. 2 and FIG. 5 is a cross-sectional view of the display device taken along the line I-I' of FIG. 4.

Referring to FIGS. 4 and 5, a display area DA of the display device according to the embodiment may include a pixel area PA in which a pixel P is arranged and light is emitted, and a transmission area TA in which the pixel P is not arranged and light is not emitted. In order to improve the transmittance of the display device, the transmission area TA may be larger than the pixel area PA including the pixel P. For example, the transmission area TA may be larger than the pixel area PA in a plan view. FIG. 4 illustrates that six pixels P are arranged in the y-direction to correspond to one transmission area TA. However, various suitable modifications are possible (e.g., four pixels P may be arranged corresponding to one transmission area TA). In one or more embodiments, the six pixels may be between two transmission areas TA in a plan view.

A first spacer 310 and a second spacer 320 may be arranged at the boundary between the pixel area PA and the transmission area TA and extend to the pixel area PA and the transmission area TA as shown in FIG. 5. The first spacer 310 and the second spacer 320 may prevent or substantially prevent an organic material forming a plurality of planarization layers arranged on the pixel area PA from being lost. The first spacer 310 and the second spacer 320 may be arranged to surround the outer peripheries of different transmission areas TA, respectively.

The substrate 100 may include the pixel area PA and the transmission area TA. The substrate 100 may include a glass material or a polymer resin, which includes (e.g., mainly includes) $SiO_2$ (e.g., as a major component). The polymer resin may include polyethersulfone, polyacrylate, polyether imide, polyethylene naphthalate, polyethylene terephthalate, polyphenylene sulfide, polyarylate, polyimide, polycarbonate, cellulose acetate propionate, or the like. The substrate 100 including the polymer resin may be flexible, rollable, or bendable. The substrate 100 may have a multilayer structure including a layer including the above-described polymer resin and an inorganic layer.

A thin film transistor including a gate electrode, a source electrode, and a drain electrode, and a storage capacitor including an upper electrode and a lower electrode may be arranged on the substrate 100.

A buffer layer 101 may be located on the substrate 100 to reduce or block the penetration of foreign matter, moisture, or external air from an external environment (e.g., the bottom of the substrate 100), and may provide a flat surface on the substrate 100. The buffer layer 101 may include an inorganic material (e.g., an oxide or a nitride), an organic material, or an organic-inorganic composite, and may have a single layer or multilayer structure including an inorganic material and an organic material. A barrier layer that blocks the penetration of external air may be further included between the substrate 100 and the buffer layer 101.

A light-blocking layer 130 may be arranged on the buffer layer 101 of the pixel area PA. The light-blocking layer 130 may be arranged to correspond to a thin film transistor to prevent or substantially prevent the gate electrode, the source electrode, and the drain electrode of the thin film transistor from being visually recognized externally. A voltage may be applied to the light-blocking layer 130. For example, the light-blocking layer 130 may be connected to the source electrode or the drain electrode of the thin film transistor. The light-blocking layer 130 is supplied with a voltage in conjunction with the potential of the source electrode or the drain electrode of the thin film transistor, and thus, the thin film transistor of the display device may be stabilized. In one or more embodiments, the light-blocking layer 130 may be connected to a separate wiring line and not to the source electrode or the drain electrode of the thin film transistor.

A first insulating layer 103 may be arranged on the light-blocking layer 130. The first insulating layer 103 may be arranged on the pixel area PA and the transmission area TA. The first insulating layer 103 may include at least one inorganic insulating material selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The first insulating layer 103 may have a single layer or multilayer structure including the inorganic insulating material described above.

A semiconductor layer 134 may be arranged on the first insulating layer 103 of the pixel area PA. The semiconductor layer 134 may include a channel region 131 overlapping a first electrode layer 136, and a source region 132 and a drain region 133 arranged on both sides of the channel region 131 and containing a higher concentration of impurities than the channel region 131. In this case, the impurities may include N-type impurities or P-type impurities. The source region 132 and the drain region 133 may be connected (e.g., electrically connected) to the source electrode and the drain electrode, respectively.

The semiconductor layer 134 may include an oxide semiconductor and/or a silicon semiconductor. When the semiconductor layer 134 includes an oxide semiconductor, the oxide semiconductor may include an oxide of at least one material selected from, for example, indium (In), gallium (Ga), tin (Sn), zirconium (Zr), vanadium (V), hafnium (Hf), cadmium (Cd), germanium (Ge), chromium (Cr), titanium (Ti), and zinc (Zn). For example, the semiconductor layer 134 may include ITZO(InSnZnO), IGZO(InGaZnO), or the like. When the semiconductor layer 134 includes a silicon semiconductor, the silicon semiconductor may include, for example, amorphous silicon (a-Si) or low temperature polysilicon (LTPS) crystallized from amorphous silicon (a-Si).

A second insulating layer 105 may be arranged on the semiconductor layer 134. The second insulating layer 105 may be arranged on the pixel area PA and the transmission area TA. The second insulating layer 105 may include at least one inorganic insulating material selected from $SiO_2$, $SiN_x$, SiON, $Al_2O_3$, $TiO_2$, $Ta_2O_5$, $HfO_2$, and $ZnO_2$. The second insulating layer 105 may have a single layer or multilayer structure including the inorganic insulating material described above.

The first electrode layer 136 may be arranged on the second insulating layer 105 of the pixel area PA. The first electrode layer 136 may have a single layer or multilayer structure including one or more metals selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The first electrode layer 136 may be connected to a gate line for applying an electrical signal to the first electrode layer 136. In one or more embodiments, the first electrode layer 136 may be a gate electrode of the thin film transistor.

A third insulating layer 107 may be arranged on the first electrode layer 136. The third insulating layer 107 may be arranged on the pixel area PA and the transmission area TA. The third insulating layer 107 may include at least one inorganic insulating material selected from $SiO_2$, $SiN_x$, SiON, $Al_2O_3$, $TiO_2$, $Ta_2O_5$, $HfO_2$, and $ZnO_2$. The third insulating layer 107 may have a single layer or multilayer structure including the inorganic insulating material described above.

A second electrode layer 137 may be arranged on the third insulating layer 107 of the pixel area PA. The second electrode layer 137 may have a single layer or multilayer structure including one or more metals selected from Al, Pt, Pd, Ag, Mg, Au, Ni, Nd, Ir, Cr, Li, Ca, Mo, Ti, W, and Cu. The second electrode layer 137 may be connected to a gate line for applying an electrical signal to the second electrode layer 137. In one or more embodiments, the second electrode layer 137 may be one of a gate electrode, a scan line SL, or a emission control line EL.

A fourth insulating layer 109 may be arranged on the second electrode layer 137. The fourth insulating layer 109 may be arranged on the pixel area PA and the transmission area TA. The fourth insulating layer 109 may include at least one inorganic insulating material selected from $SiO_2$, $SiN_x$, SiON, $Al_2O_3$, $TiO_2$, $Ta_2O_5$, $HfO_2$, and $ZnO_2$. The fourth insulating layer 109 may have a single layer or multilayer structure including the inorganic insulating material described above.

A third electrode layer 138 may be arranged on the fourth insulating layer 109 of the pixel area PA. The third electrode layer 138 may have a single layer or multilayer structure including one or more metals selected from Al, Pt, Pd, Ag, Mg, Au, Ni, Nd, Ir, Cr, Li, Ca, Mo, Ti, W, and Cu. The third electrode layer 138 may be connected to a gate line for applying an electrical signal to the third electrode layer 138.

A fifth insulating layer 111 may be arranged on the third electrode layer 138. The fifth insulating layer 111 may be arranged on the pixel area PA and the transmission area TA. The fifth insulating layer 111 may include at least one inorganic insulating material selected from $SiO_2$, $SiN_x$, SiON, $Al_2O_3$, $TiO_2$, $Ta_2O_5$, $HfO_2$, and $ZnO_2$. The fifth insulating layer 111 may have a single layer or multilayer structure including the inorganic insulating material described above.

A first conductive layer 139 and a second conductive layer 141 may be arranged on the fifth insulating layer 111 of the pixel area PA. Each of the first conductive layer 139 and the second conductive layer 141 may have a single layer or multilayer structure including one or more metals selected from Al, Pt, Pd, Ag, Mg, Au, Ni, Nd, Ir, Cr, Li, Ca, Mo, Ti, W, and Cu. The first conductive layer 139 and the second conductive layer 141 may be connected to a gate line for applying an electrical signal to the first conductive layer 139 and the second conductive layer 141.

The first conductive layer 139 and the second conductive layer 141 may be spaced apart from each other and arranged on the same layer. In one or more embodiments, each of the first conductive layer 139 and the second conductive layer 141 may be the source electrode or the drain electrode of the thin film transistor. In FIG. 5, two conductive layers are arranged on the fifth insulating layer 111. However, in one or more embodiments, four or six conductive layers may be arranged on the fifth insulating layer 111.

The first conductive layer 139 may include a first sidewall 139a having a first inclination angle θ1 and a second sidewall 139b having a second inclination angle θ2 different from the first inclination angle θ1. The second conductive layer 141 may include a third sidewall 141a having a third inclination angle θ3 and a fourth sidewall 141b having a fourth inclination angle θ4 different from the third inclination angle θ3. The inclination angle of the first sidewall 139a, which is a sidewall close to the transmission area TA, from among the first sidewall 139a and the second sidewall 139b of the first conductive layer 139 arranged on the pixel area PA may be relatively steep compared to the inclination angle of the second sidewall 139b. In other words, the first sidewall 139a which is closer to the transmission area TA than the second sidewall 139b may have a steeper inclination angle than the second sidewall 139b. The inclination angle of the fourth sidewall 141b, which is a sidewall close to the transmission area TA, from among the third sidewall 141a and the fourth sidewall 141b of the second conductive layer 141 arranged on the pixel area PA may be relatively steep compared to the inclination angle of the third sidewall 141a. In other words, the fourth sidewall 141b which is closer to the transmission area TA than the third sidewall 141a may have a steeper inclination angle than the third sidewall 141a. In one or more embodiments, the first inclination angle θ1 and the fourth inclination angle θ4 may be 70 degrees or more and 90 degrees or less, and the second inclination angle θ2 and the third inclination angle θ3 may be less than 70 degrees.

As the inclination angle of a sidewall close to the transmission area TA is relatively steep, a spacer may be arranged at the boundary between the pixel area PA and the transmission area TA and extend to the pixel area PA and the transmission area TA. This will be described in more detail in a method of manufacturing the display device.

A first spacer 310 and a second spacer 320 may be arranged on the fifth insulating layer 111, and the first spacer 310 and the second spacer 320 may be located at the boundary between the pixel area PA and the transmission area TA and extend to the pixel area PA and the transmission area TA.

The first conductive layer 139, the second conductive layer 141, the first spacer 310, and the second spacer 320 may be arranged on the same layer. The first spacer 310 may be in contact (e.g., direct contact) with the first sidewall 139a of the first conductive layer 139, extend from the boundary between the pixel area PA and the transmission area TA to the pixel area PA and the transmission area TA, and be arranged on the fifth insulating layer 111. The second spacer 320 may be in contact (e.g., direct contact) with the fourth sidewall 141b of the second conductive layer 141, extend from the boundary between the pixel area PA and the transmission area TA to the pixel area PA and the transmission area TA, and be arranged on the fifth insulating layer 111.

Although the first spacer 310 and the second spacer 320 are described as being in contact with the first sidewall 139a and the fourth sidewall 141b respectively, embodiments of the present disclosure are not limited hereto. For example, in one or more embodiments, the first spacer 310 may be spaced apart from the first sidewall 139a of the first conductive layer 139, extend from the boundary between the pixel area PA and the transmission area TA to the pixel area PA and the transmission area TA, and be arranged on the fifth insulating layer 111. In one or more embodiments, the second spacer 320 may be spaced apart from the fourth sidewall 141b of the second conductive layer 141, extend from the boundary between the pixel area PA and the transmission area TA to the pixel area PA and the transmission area TA, and be arranged on the fifth insulating layer 111.

The first spacer 310 may have a first height h1 from the top surface of the fifth insulating layer 111, and the first conductive layer 139 may have a second height h2 from the top surface of the fifth insulating layer 111. In one or more embodiments, the first height h1 and the second height h2 may be equal to or substantially equal to each other. That is, the first spacer 310 and the first conductive layer 139 may have the same height from the top surface of the fifth insulating layer 111. Each of the first spacer 310 and the second spacer 320 may include at least one inorganic insulating material selected from $SiO_2$, $SiN_x$, SiON, $Al_2O_3$, $TiO_2$, $Ta_2O_5$, $HfO_2$, and $ZnO_2$.

The third electrode layer 138 and the first conductive layer 139 may be arranged to face each other with the fifth insulating layer 111 therebetween. As the third electrode layer 138 and the first conductive layer 139 are arranged to face each other, a storage capacitor Cst having the third electrode layer 138 as a lower electrode and the first conductive layer 139 as an upper electrode may be formed. The storage capacitor Cst may have a large area through the third electrode layer 138 and the first conductive layer 139, thereby increasing the storage capacity of the storage capacitor Cst.

A first planarization layer 113 may be arranged on the first conductive layer 139 and the second conductive layer 141. The first planarization layer 113 may be located within the first spacer 310 and the second spacer 320 in the cross-sectional view. That is, the ends of the first planarization layer 113 arranged on the first conductive layer 139 and the second conductive layer 141 may be located on the first spacer 310 and the second spacer 320, and thus, the first planarization layer 113 may not be arranged beyond the first spacer 310 and the second spacer 320, but may be arranged only within the first spacer 310 and the second spacer 320. In one or more embodiments, the first spacer 310 and the second spacer 320 extend beyond the first planarization layer 113 in the −x-direction and x-direction respectively. For example, in one or more embodiments, the first planarization layer 113 may be within adjacent boundaries between the pixel area PA and the transmission area TA in contrast to the first spacer 310 and the second spacer 320 that each extend from the boundary between the pixel area PA and the transmission area TA to the pixel area PA and the transmission area TA.

The first planarization layer 113 may have a single layer or multilayer structure including an organic material or an inorganic material. The first planarization layer 113 may include general-purpose polymer, such as benzocyclobutene (BCB), polyimide (PI), hexamethyldisiloxane (HMDSO), polymethylmethacrylate (PMMA), or polystyrene (PS), a polymer derivative having a phenol-based group, acryl-based polymer, imide-based polymer, aryl ether-based polymer, amide-based polymer, fluorine-based polymer, p-xylene-based polymer, vinyl alcohol-based polymer, or a blend thereof. The first planarization layer 113 may include $SiO_2$, $SiN_x$, SiON, $Al_2O_3$, $TiO_2$, $Ta_2O_5$, $HfO_2$, $ZnO_2$, or the like. After the forming of the first planarization layer 113, chemical mechanical polishing may be performed to provide a flat upper surface.

The first spacer 310 and the second spacer 320 arranged on the fifth insulating layer 111 may serve as an alignment point such that the first planarization layer 113 may be arranged only in the pixel area PA. The first spacer 310 and the second spacer 320 may serve as an alignment point, thereby preventing or substantially preventing an organic material forming the first planarization layer 113 from being arranged on the transmission area TA and preventing or substantially preventing the organic material being lost.

A third conductive layer 143 may be arranged on the first planarization layer 113. The third conductive layer 143 may have a single layer or multilayer structure including one or more metals selected from Al, Pt, Pd, Ag, Mg, Au, Ni, Nd, Ir, Cr, Li, Ca, Mo, Ti, W, and Cu.

A second planarization layer 117 may be arranged on the third conductive layer 143. The second planarization layer 117 may have a single layer or multilayer structure including an organic material or an inorganic material. The second planarization layer 117 may include general-purpose polymer, such as BCB, PI, HMDSO, PMMA, or PS, a polymer derivative having a phenol-based group, acryl-based polymer, imide-based polymer, aryl ether-based polymer, amide-based polymer, fluorine-based polymer, p-xylene-based polymer, vinyl alcohol-based polymer, or a blend thereof. The second planarization layer 117 may include $SiO_2$, $SiN_x$, SiON, $Al_2O_3$, $TiO_2$, $Ta_2O_5$, $HfO_2$, $ZnO_2$, or the like. After the forming of the second planarization layer 117, chemical mechanical polishing may be performed to provide a flat upper surface.

A pixel electrode 210 may be arranged on the second planarization layer 117. The pixel electrode 210 may be a (semi) transparent electrode or a reflective electrode. The pixel electrode 210 may include a reflective electrode including Ag, Mg, Al, Pt, Pd, Au, Ni, Nd, Ir, Cr, a compound thereof, or the like, and a transparent or semi translucent electrode layer formed on the reflective layer. The transparent or semi transparent electrode layer may include at least one selected from indium tin oxide (ITO), indium zinc oxide (IZO), zinc oxide (ZnO), indium oxide ($In_2O_3$), indium gallium oxide (IGO), and aluminum zinc oxide (AZO). The pixel electrode 210 may have a stacked structure of ITO/Ag/ITO.

A pixel-defining layer 180 may be arranged on the second planarization layer 117, and the pixel-defining layer 180 may have an opening exposing at least a portion of the pixel electrode 210. The pixel-defining layer 180 may be configured to increase a distance between an end of the pixel electrode 210 and an opposite electrode 230 (see FIG. 9) above the pixel electrode 210. Thus, an arc may be prevented or substantially prevented from occurring in the end of the pixel electrode 210. The pixel-defining layer 180 may include an organic insulating material, such as polyimide, polyamide, acrylic resin, benzocyclobutene, hexamethyldisiloxane, or phenol resin, and may be formed using a method such as spin coating.

Because a plurality of planarization layers are arranged in the pixel area PA and a plurality of planarization layers are not arranged in the transmission area TA, the pixel area PA may have a first transmittance and the transmission area TA may have a second transmittance higher than the first transmittance.

Figure 6:
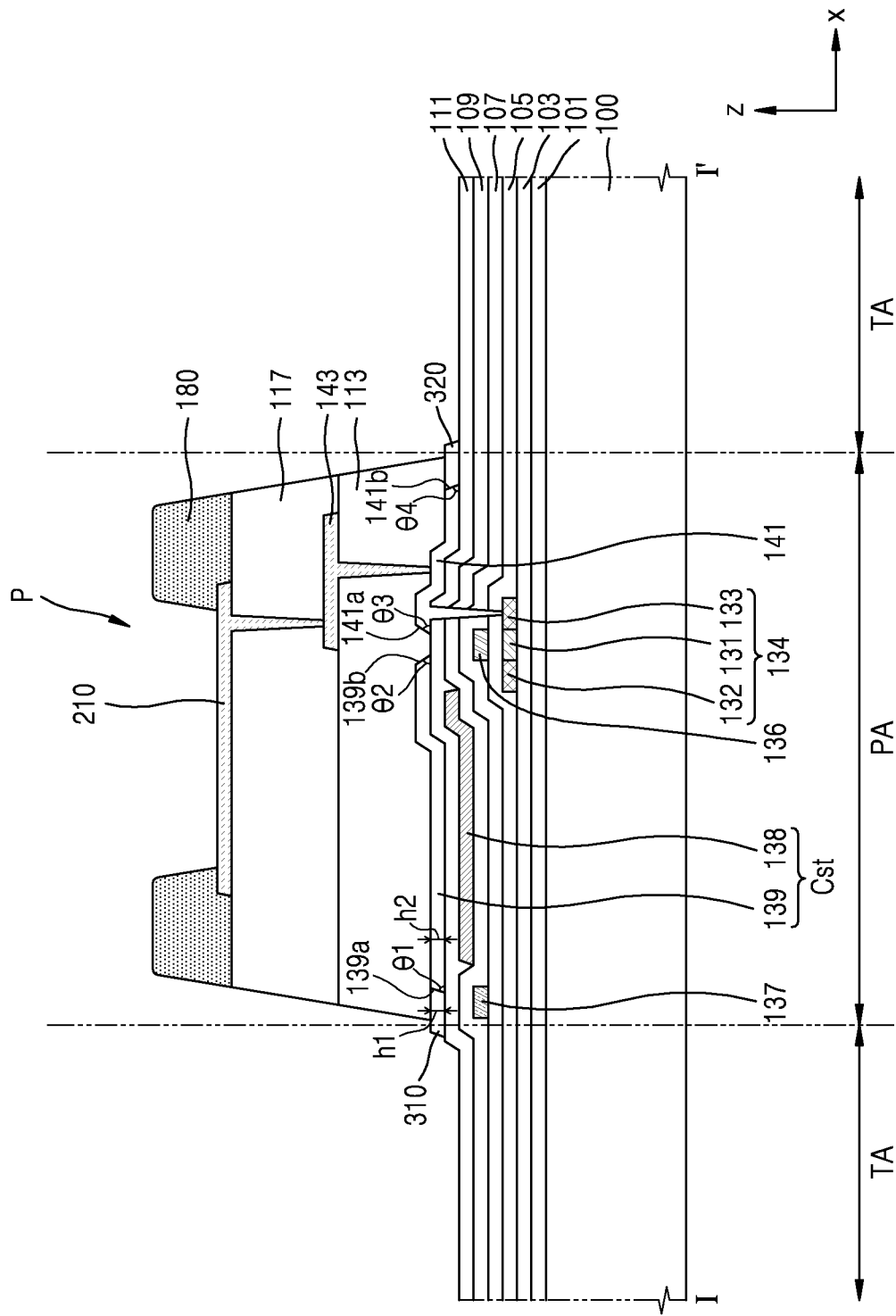
FIG. 6 is a schematic cross-sectional view of a display device taken along the line I-I' according to an embodiment.

FIG. 6 is a schematic cross-sectional view of a display device taken along the line I-I' according to an embodiment. The embodiment of FIG. 6 is different from the embodiment of FIG. 5 in that the light-blocking layer 130 is not arranged on a buffer layer 101. Description of the same configuration as that of FIG. 5 in the configuration of FIG. 6 may be omitted, and differences will be described below.

Referring to FIG. 6, the buffer layer 101 may be arranged on a substrate 100, a first insulating layer 103 may be arranged on the buffer layer 101, and a semiconductor layer 134 may be arranged on the first insulating layer 103. In one or more embodiments, the first insulating layer 103 arranged between the buffer layer 101 and the semiconductor layer 134 may be omitted.

As the light-blocking layer 130 arranged between the buffer layer 101 and the first insulating layer 103 is omitted, the manufacturing process of the display device may be simplified, and the height between the substrate 100 and a plurality of planarization layers (i.e., the first and second planarization layers 113 and 117) may be reduced to thereby reduce loss of an organic material forming the first planarization layer 113 and the second planarization layer 117.

Figure 7:
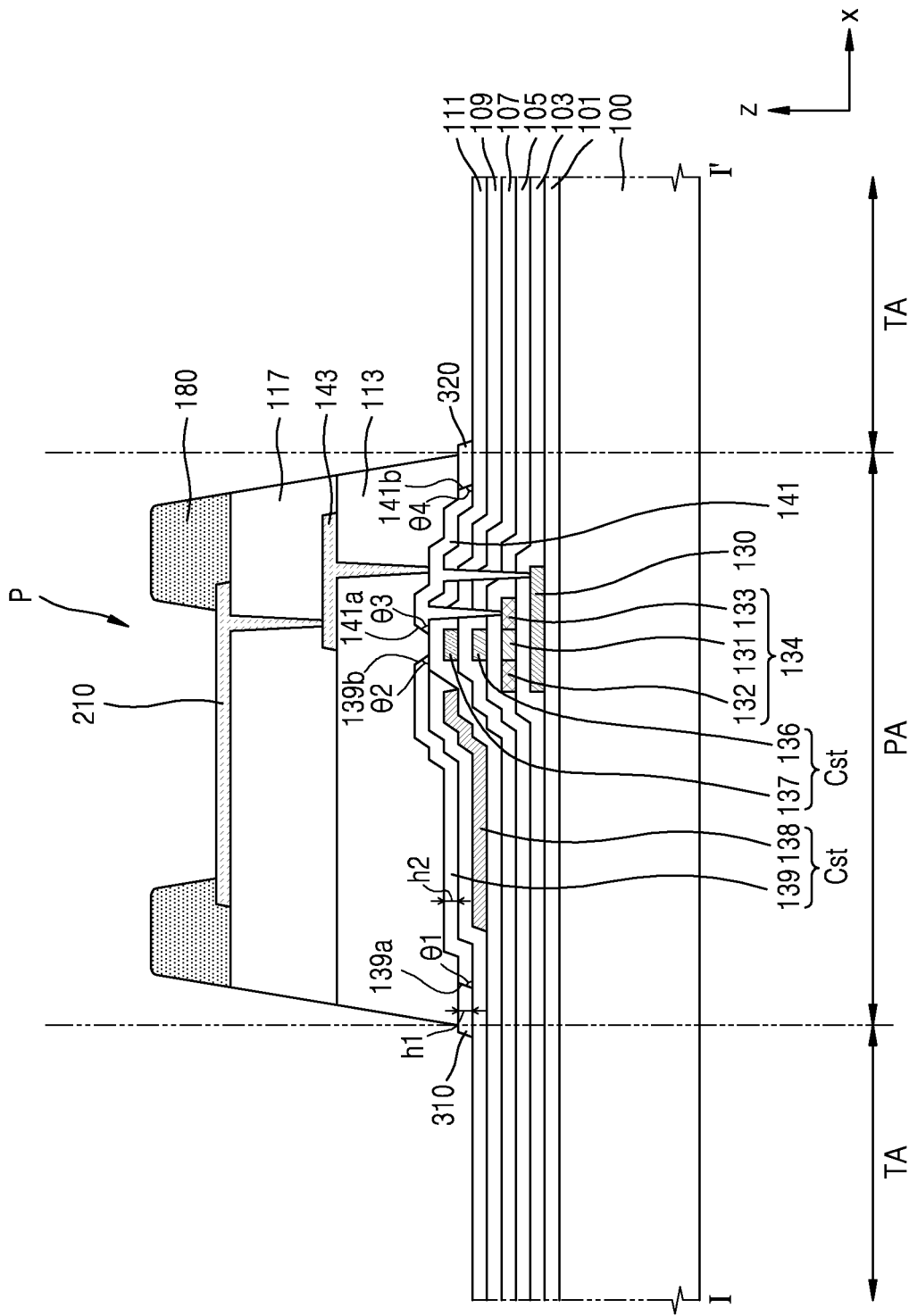
FIG. 7 is a schematic cross-sectional view of a display device taken along the line I-I' according to an embodiment.

FIG. 7 is a schematic cross-sectional view of a display device taken along the line I-I' according to an embodiment. The embodiment of FIG. 7 is different from the embodiment of FIG. 5 in that a second electrode layer 137 is arranged on a first electrode layer 136 to overlap the first electrode layer 136. Description of the same configuration as that of FIG. 5 in the configuration of FIG. 7 may be omitted, and differences will be described below.

Referring to FIG. 7, the second electrode layer 137 may be arranged on the first electrode layer 136, and the first electrode layer 136 and the second electrode layer 137 may be arranged to face each other with a third insulating layer 107 therebetween. As the first electrode layer 136 and the second electrode layer 137 are arranged to face each other, a storage capacitor Cst having the first electrode layer 136 as a lower electrode and the second electrode layer 137 as an upper electrode may be formed.

Figure 8:
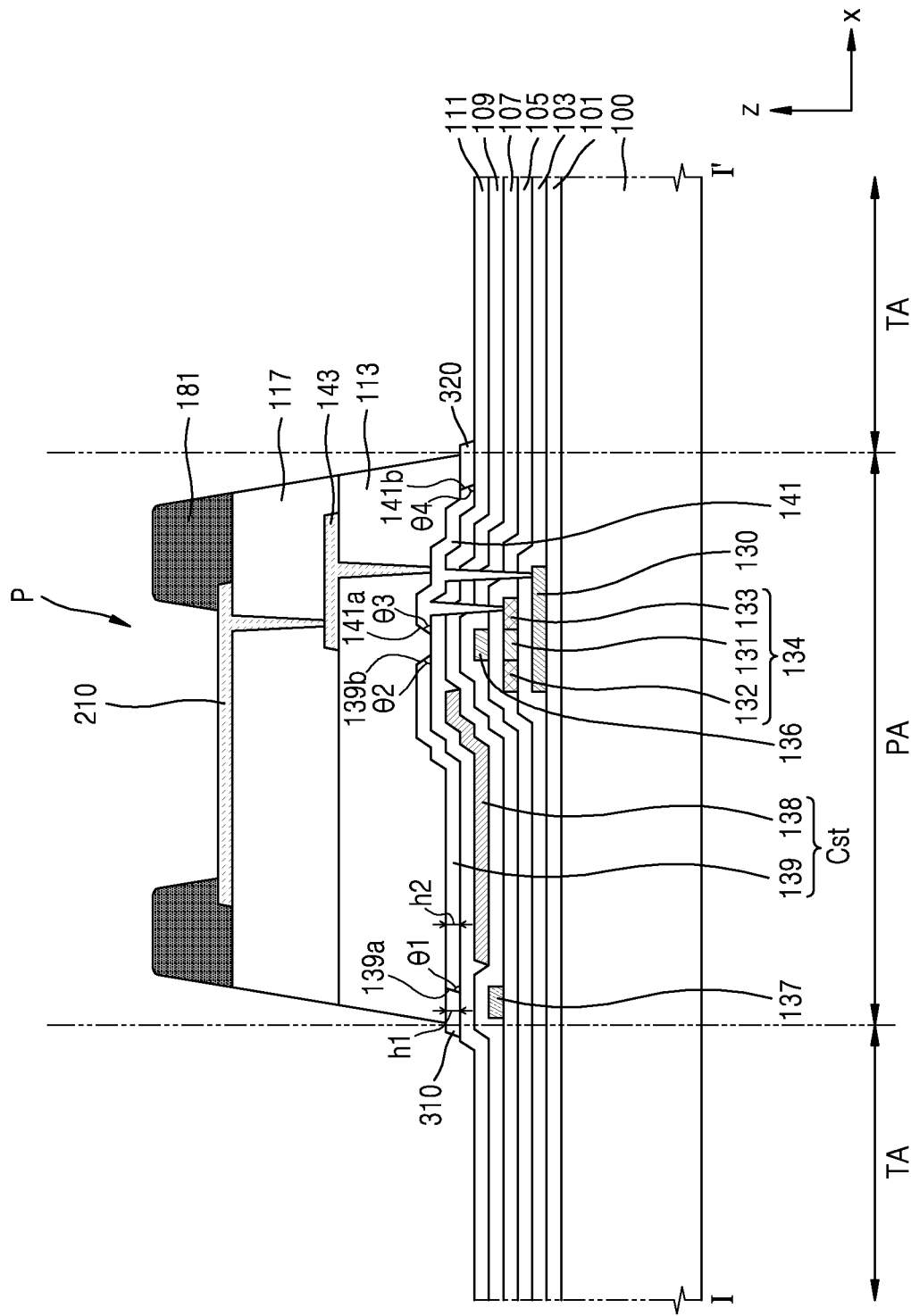
FIG. 8 is a schematic cross-sectional view of a display device taken along the line I-I' according to an embodiment.

FIG. 8 is a schematic cross-sectional view of a display device taken along the line I-I' according to an embodiment. The embodiment of FIG. 8 is different from the embodiment of FIG. 5 in that an organic layer 181 including a light-blocking material is arranged instead of the pixel-defining layer 180. Description of the same configuration as that of FIG. 5 in the configuration of FIG. 8 may be omitted, and differences will be described below.

Referring to FIG. 8, a second planarization layer 117 may be arranged on a substrate 100, a pixel electrode 210 may be arranged on the second planarization layer 117, and the organic layer 181 exposing at least a portion of the pixel electrode 210 may be arranged on the second planarization layer 117. The organic layer 181 may include a light-blocking material, and the light-blocking material may be a black matrix. The black matrix may include various suitable materials, for example, chromium (Cr), chromium oxide ($CrO_x$), or an organic material mixed with a black pigment. When the black matrix is formed of Cr or $CrO_x$, the black matrix may include a single layer or multiple layers of Cr or $CrO_x$. When the display device includes the black matrix, the display device may sufficiently prevent or reduce reflection of external light.

Figure 9:
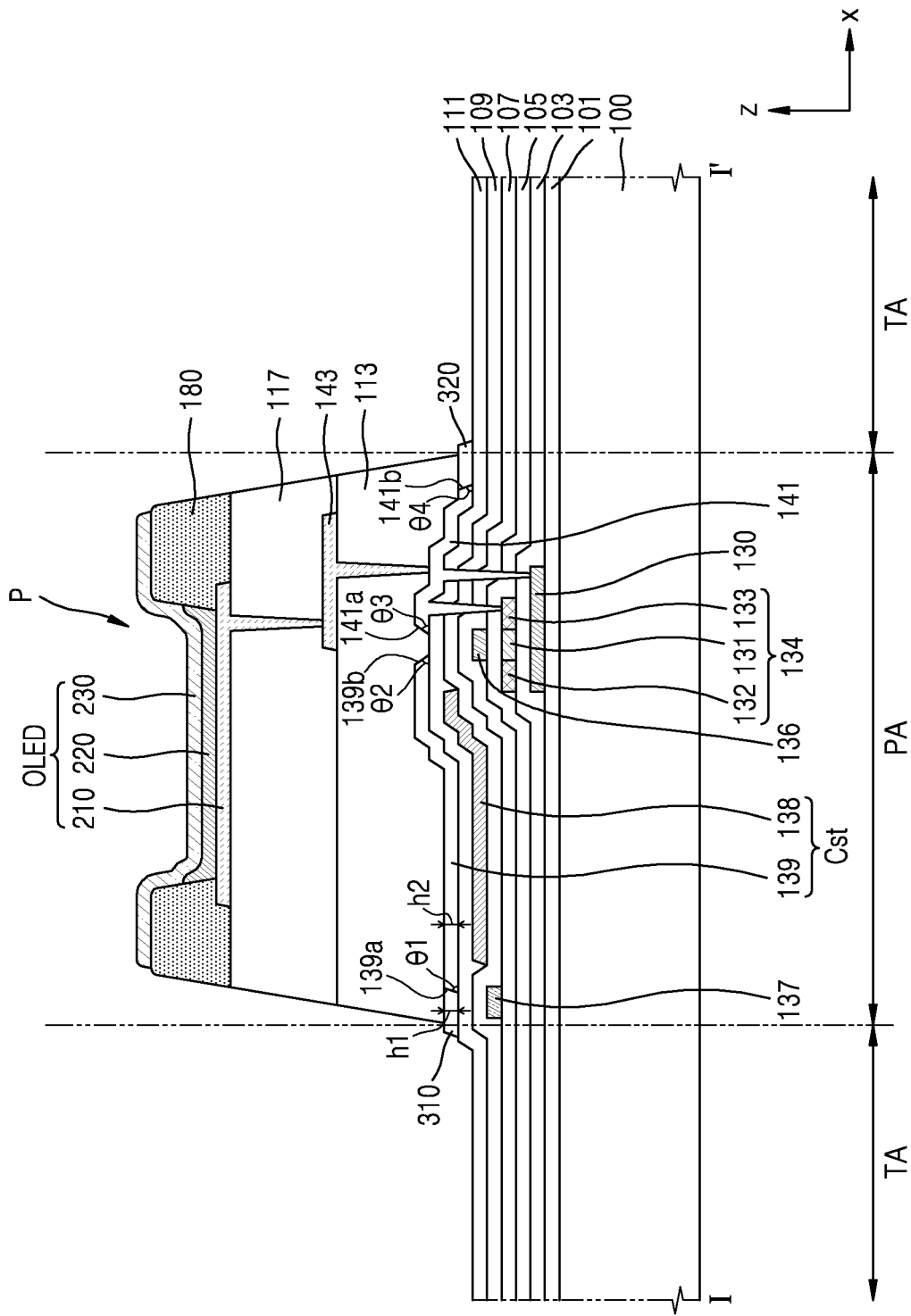
FIG. 9 is a schematic cross-sectional view of a display device taken along the line I-I' according to an embodiment.

FIG. 9 is a schematic cross-sectional view of a display device taken along the line I-I' according to an embodiment. The embodiment of FIG. 9 is different from the embodiment of FIG. 5 in that an intermediate layer 220 and an opposite electrode 230 are arranged on a pixel electrode 210. Description of the same configuration as that of FIG. 5 in the configuration of FIG. 9 may be omitted, and differences will be described below.

Referring to FIG. 9, the intermediate layer 220 may be arranged on the pixel electrode 210 at least partially exposed by a pixel-defining layer 180. The intermediate layer 220 may include an emission layer (EML) and may further include functional layers, such as a hole transport layer (HTL), a hole injection layer (HIL), an electron transport layer (ETL), and an electron injection layer (EIL), which are optionally arranged under and on the EML.

The EML may include an organic material including a fluorescent or phosphorescent material emitting red, green, blue, or white light. The EML may include a low molecular weight organic material or a polymer organic material.

When the EML includes a low molecular weight material, the intermediate layer 220 may have a structure in which an HIL, an HTL, an EML, an ETL, and an EIL are stacked in a single or composite structure, and may include various suitable organic materials, such as copper phthalocyanine (CuPc), N,N'-Di(napthalene-1-yl)-N,N'-diphenyl-benzidine: NPB), and/or tris-8-hydroxyquinoline aluminum)(Alq3)). These layers may be formed using a method such as vacuum deposition.

When the EML includes a polymer material, the intermediate layer 220 may have a structure including an HTL and an EML. In this case, the HTL may include poly(3,4-ethylenedioxythiophene) (PEDOT), and the EML may include a polymer material, such as poly-phenylene vinylene-based polymer or polyfluorene-based polymer. The EML may be formed using screen printing or inkjet printing, or laser induced thermal imaging (LITI).

The opposite electrode 230 may be arranged on the intermediate layer 220. In one or more embodiments, the opposite electrode 230 may be arranged on the intermediate layer 220 so as to entirely cover the intermediate layer 220. In one or more embodiments, the opposite electrode 230 may be arranged above the pixel area PA so as to entirely cover the pixel area PA. That is, the opposite electrode 230 may be formed as a single body so as to cover the plurality of pixels P arranged in the pixel area PA. Although the opposite electrode 230 is described as above the pixel area PA, embodiments of the present disclosure are not limited hereto. In one or more embodiments, at least a portion of the opposite electrode 230 may extend toward the transmission area TA and be arranged on the transmission area TA.

FIGS. 10A-10F are schematic cross-sectional views illustrating a process of manufacturing a display device according to an embodiment.

Hereinafter, a method of manufacturing the display device will be sequentially described with reference to FIGS. 10A-10F.

Referring to FIGS. 10A-10F, the method of manufacturing the display device, according to an embodiment, may include preparing a substrate 100 including a pixel area PA and a transmission area TA, forming a plurality of insulating layers on the pixel area PA and the transmission area TA, forming a first conductive layer 139 and a second conductive layer 141 on the plurality of insulating layers of the pixel area PA, forming an inorganic layer 300 on the first conductive layer 139 and the second conductive layer 141, and forming a first spacer 310 and a second spacer 320 by etching the inorganic layer 300. The first conductive layer 139 may include a first sidewall 139a having a first inclination angle θ1 and a second sidewall 139b having a second inclination angle θ2 different from the first inclination angle θ1, and the second conductive layer 141 may include a third sidewall 141a having a third inclination angle 83 and a fourth sidewall 141b having a fourth inclination angle θ4 different from the third inclination angle θ3. In one or more embodiments, the first sidewall 139a may be closer to the boundary between the pixel area PA and the transmission area TA than the second sidewall 139b is to the boundary. In one or more embodiments, the fourth sidewall 141b may be closer to the boundary between the pixel area PA and the transmission area TA than the third sidewall 141a is to the boundary.

Figure 10A:
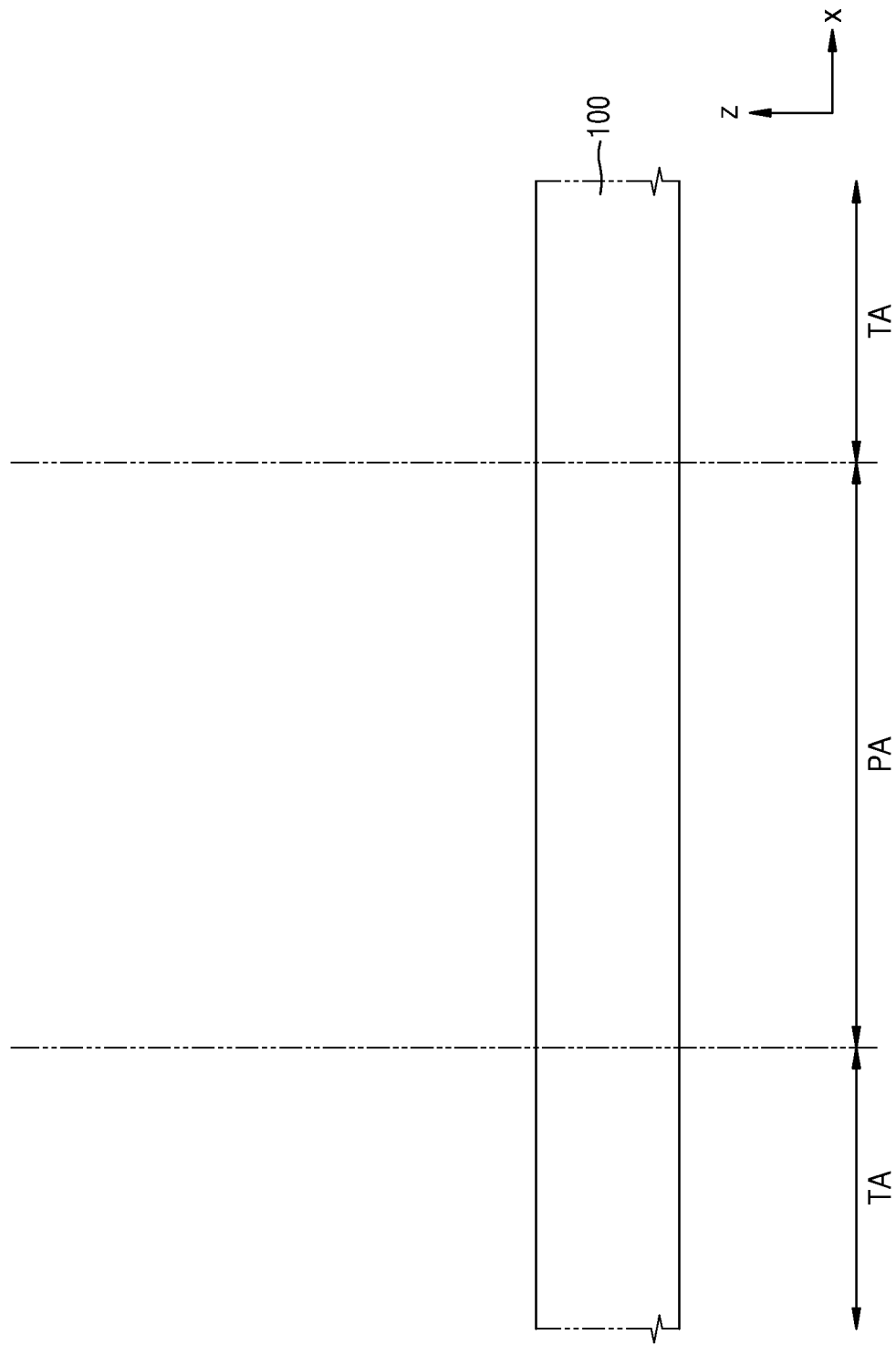

Referring to FIG. 10A, the substrate 100 may include the pixel area PA and the transmission area TA. The substrate 100 may include a glass material or a polymer resin, which mainly includes $SiO_2$. The polymer resin may include polyethersulfone, polyacrylate, polyether imide, polyethylene naphthalate, polyethylene terephthalate, polyphenylene sulfide, polyarylate, polyimide, polycarbonate, cellulose acetate propionate, or the like. The substrate 100 including the polymer resin may be flexible, rollable, or bendable. The substrate 100 may have a multilayer structure including a layer including the above-described polymer resin and an inorganic layer.

Referring to FIG. 10B, in one or more embodiments, the method further includes forming a plurality of insulating layers on the pixel area PA and the transmission area TA after (or in response to) preparing the substrate 100 including the pixel area PA and the transmission area TA. The forming the plurality of insulating layers on the pixel area PA and the transmission area TA may include forming a buffer layer 101 on the pixel area PA and the transmission area TA, forming a light-blocking layer 130 on the buffer layer 101 of the pixel area PA, forming a first insulating layer 103 on the light-blocking layer 130 of the pixel area PA and the buffer layer 101 of the transmission area TA, forming a semiconductor layer 134 on the first insulating layer 103 of the pixel area PA, forming a second insulating layer 105 on the semiconductor layer 134 of the pixel area PA and the first insulating layer 103 of the transmission area TA, forming a first electrode layer 136 on the second insulating layer 105 of the pixel area PA, forming a third insulating layer 107 on the first electrode layer 136 of the pixel area PA and the second insulating layer 105 of the transmission area TA, forming a second electrode layer 137 on the third insulating layer 107 of the pixel area PA, forming a fourth insulating layer 109 on the second electrode layer 137 of the pixel area PA and the third insulating layer 107 of the transmission area TA, forming a third electrode layer 138 on the fourth insulating layer 109 of the pixel area PA, and forming a fifth insulating layer 111 on the third electrode layer 138 of the pixel area PA and the fourth insulating layer 109 of the transmission area TA.

The buffer layer 101 may be located on the substrate 100 to reduce or block the penetration of foreign matter, moisture, or external air from the bottom of the substrate 100, and may provide a flat surface on the substrate 100. The buffer layer 101 may include an inorganic material (e.g., an oxide or a nitride), an organic material, or an organic-inorganic composite, and may have a single layer or multilayer structure including an inorganic material and an organic material. A barrier layer that blocks the penetration of external air may be further included between the substrate 100 and the buffer layer 101.

The light-blocking layer 130 may be arranged to correspond to a thin film transistor to prevent or substantially prevent the gate electrode, the source electrode, and the drain electrode of the thin film transistor from being visually recognized externally. In one or more embodiments, the forming the light-blocking layer 130 may be omitted.

Each of the first insulating layer 103, the second insulating layer 105, the third insulating layer 107, the fourth insulating layer 109, and the fifth insulating layer 111 may include at least one inorganic insulating material selected from $SiO_2$, $SiN_x$, SiON, $Al_2O_3$, $TiO_2$, $Ta_2O_5$, $HfO_2$, and $ZnO_2$. Each of the first insulating layer 103, the second insulating layer 105, the third insulating layer 107, the fourth insulating layer 109, and the fifth insulating layer 111 may have a single layer or multilayer structure including the inorganic insulating material described above.

Each of the first electrode layer 136, the second electrode layer 137, and the third electrode layer 138 may have a single layer or multilayer structure including one or more metals selected from Al, Pt, Pd, Ag, Mg, Au, Ni, Nd, Ir, Cr, Li, Ca, Mo, Ti, W, and Cu.

Figure 10C:
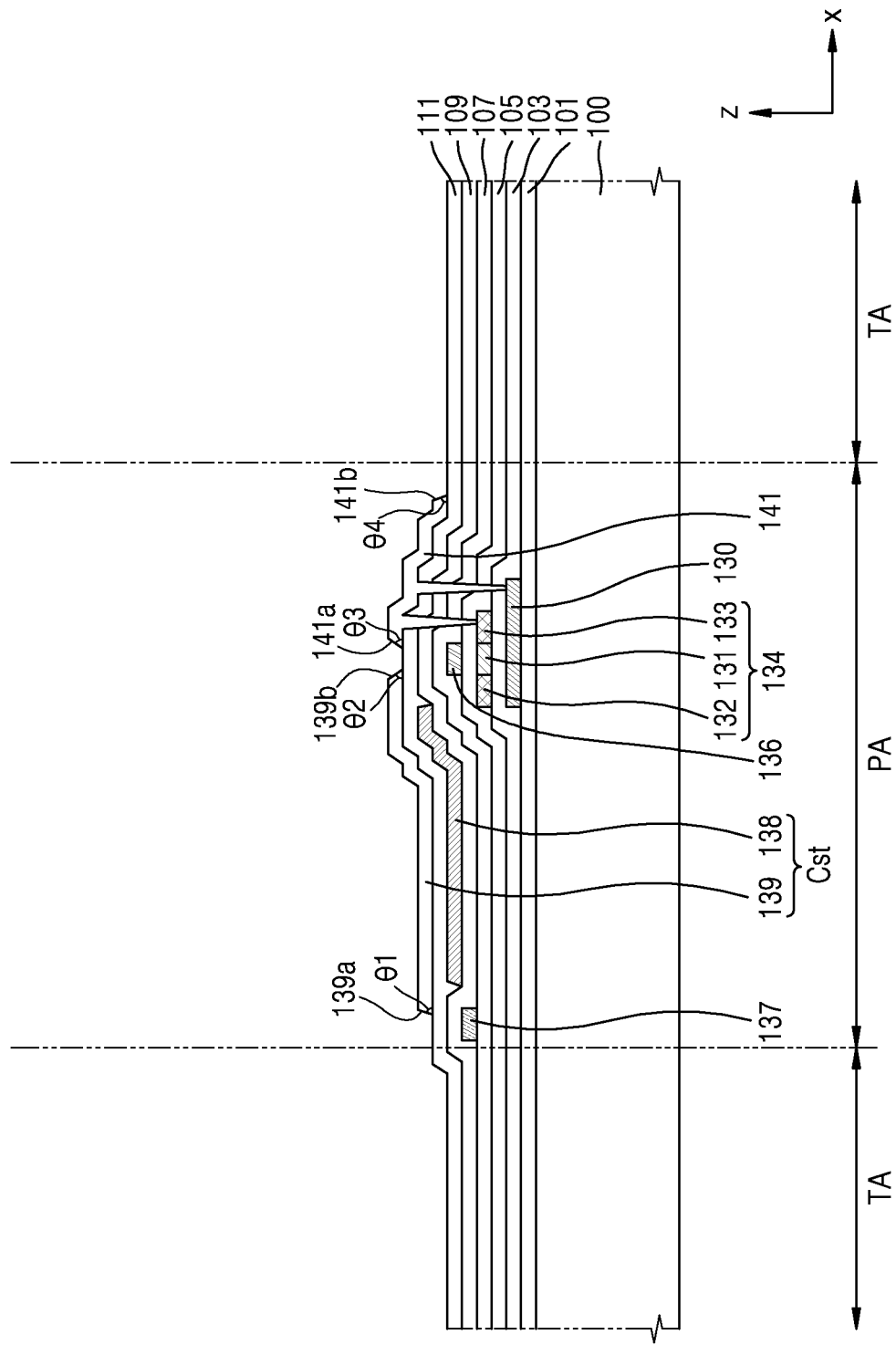

Referring to FIG. 10C, in one or more embodiments, the method further includes forming a first conductive layer 139 and a second conductive layer 141 on the plurality of insulating layers of the pixel area PA after (or in response to) the forming the plurality of insulating layers on the pixel area PA and the transmission area TA. As described above, the first conductive layer 139 may include the first sidewall 139a having the first inclination angle θ1 and the second sidewall 139b having the second inclination angle θ2 different from the first inclination angle θ1, and the second conductive layer 141 may include the third sidewall 141a having the third inclination angle θ3 and the fourth sidewall 141b having the fourth inclination angle θ4 different from the third inclination angle θ3.

The inclination angle of the first sidewall 139a of the first sidewall 139a, which is a sidewall close to the transmission area TA, from among the first sidewall 139a and the second sidewall 139b of the first conductive layer 139 formed on the pixel area PA, may be relatively steep compared to the inclination angle of the second sidewall 139b. In other words, the first sidewall 139a which is closer to the transmission area TA (than the second sidewall 139b is to the transmission area TA) may have a steeper inclination angle than the second sidewall 139b. The inclination angle of the fourth sidewall 141b, which is a sidewall close to the transmission area TA, from among the third sidewall 141a and the fourth sidewall 141b of the second conductive layer 141 formed on the pixel area PA, may be relatively steep compared to the inclination angle of the third sidewall 141a. In other words, the fourth sidewall 141b which is closer to the transmission area TA (than the third sidewall 141a is to the transmission are TA) may have a steeper inclination angle than the third sidewall 141a. In one or more embodiments, the first inclination angle θ1 and the fourth inclination angle θ4 may be 70 degrees or more and 90 degrees or less, and the second inclination angle θ2 and the third inclination angle θ3 may be less than 70 degrees.

The third electrode layer 138 and the first conductive layer 139 may be arranged to face each other with the fifth insulating layer 111 therebetween. As the third electrode layer 138 and the first conductive layer 139 are arranged to face each other, a storage capacitor Cst may be formed. As the third electrode layer 138 and the first conductive layer 139 form the storage capacitor Cst having a large area, the storage capacity of the storage capacitor Cst may increase.

Figure 10D:
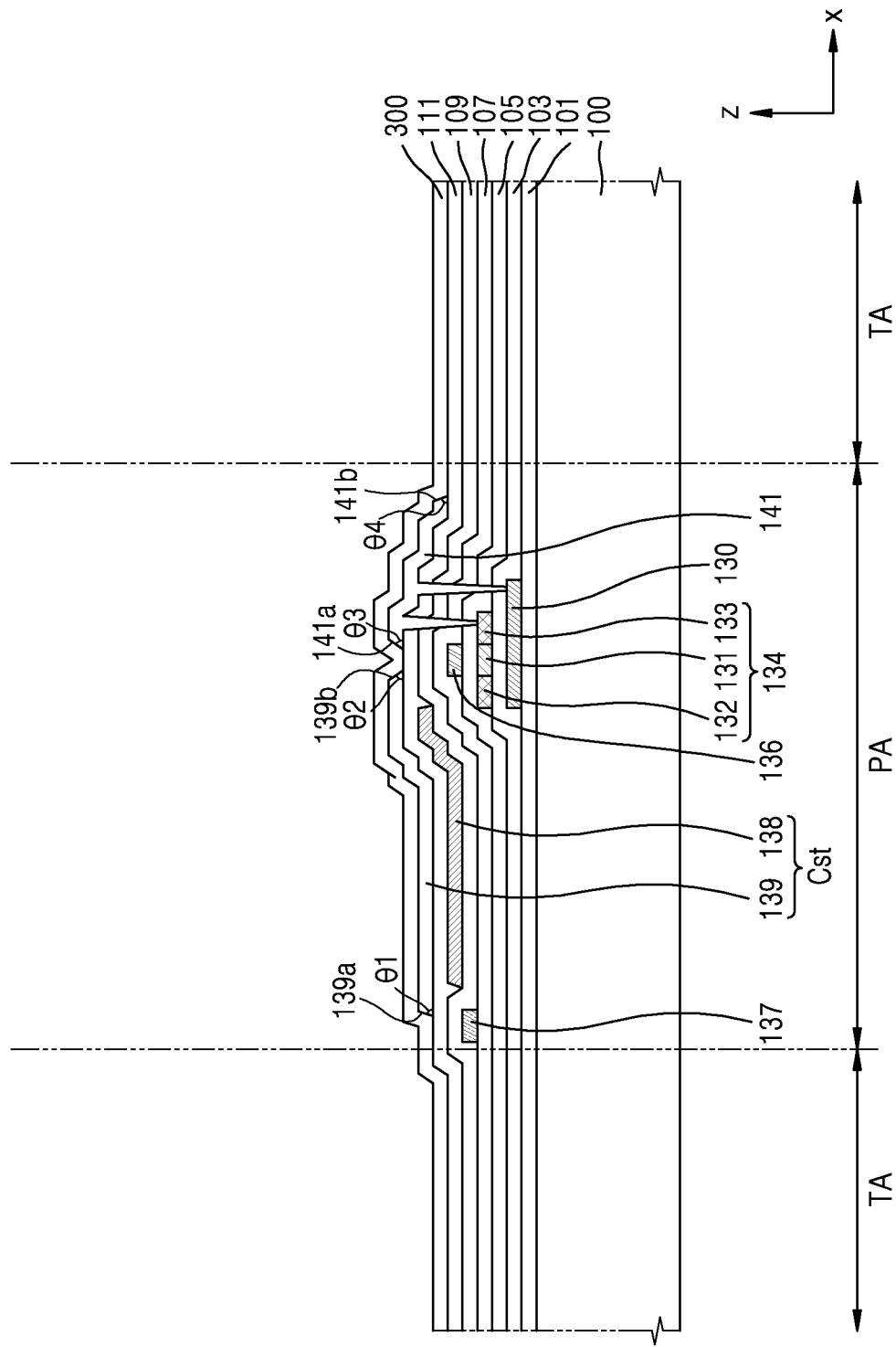

Referring to FIG. 10D, in one or more embodiments, the method further includes forming an inorganic layer 300 on the first conductive layer 139 and the second conductive layer 141 after (or in response to) the forming the first conductive layer 139 and the second conductive layer 141 on the plurality of insulating layers of the pixel area PA. As described above, the first conductive layer 139 may include the first sidewall 139a having the first inclination angle θ1 and the second sidewall 139b having the second inclination angle θ2 different from the first inclination angle θ1, and the second conductive layer 141 may include the third sidewall 141a having the third inclination angle θ3 and the fourth sidewall 141b having the fourth inclination angle θ4 different from the third inclination angle θ3. The inorganic layer 300 may be formed on the first conductive layer 139 and the second conductive layer 141, but may also be formed on the transmission region TA. The inorganic layer 300 may include at least one inorganic insulating material selected from $SiO_2$, $SiN_x$, SiON, $Al_2O_3$, $TiO_2$, $Ta_2O_5$, $HfO_2$, and $ZnO_2$.

Figure 10E:
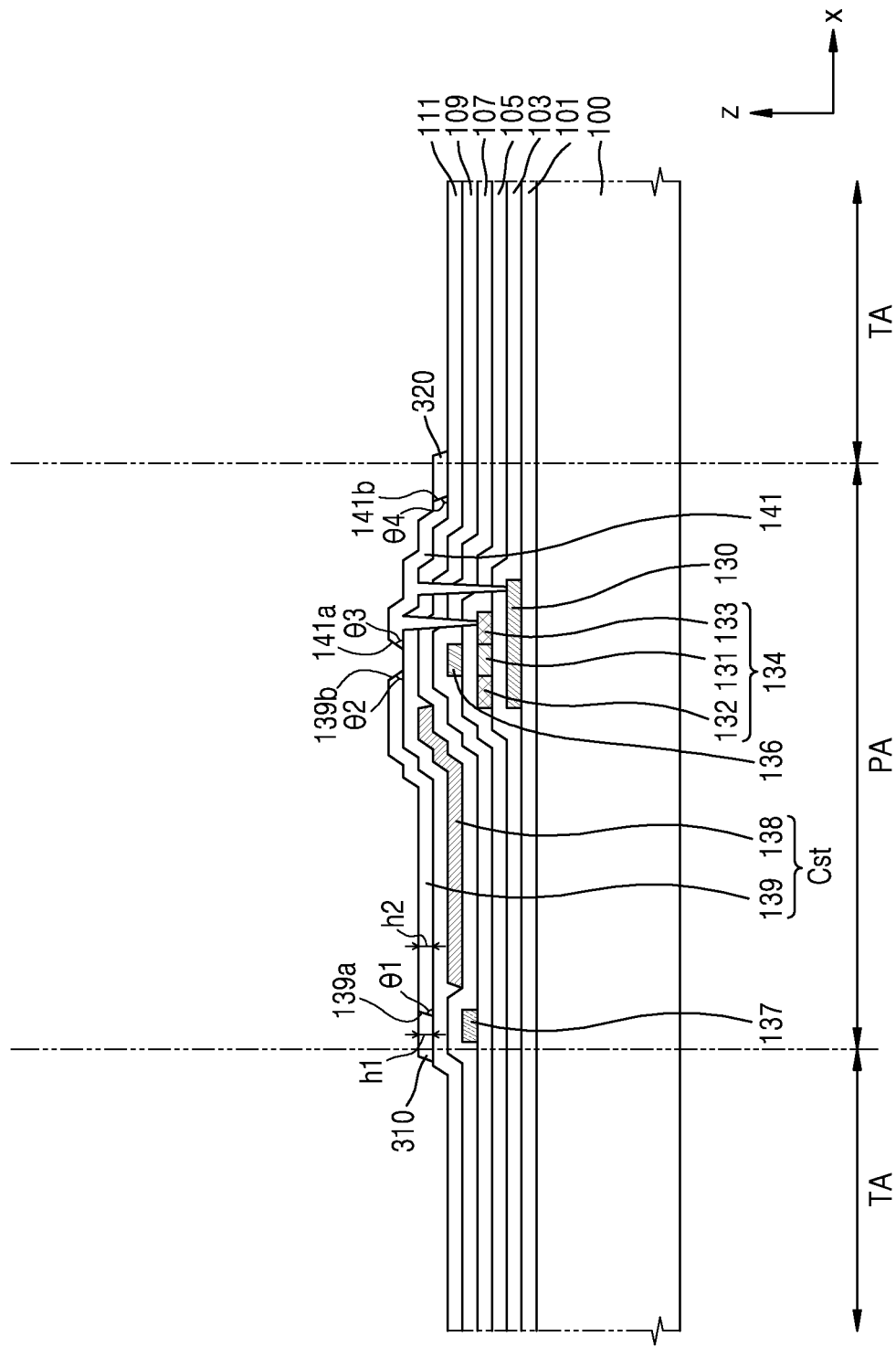

Referring to FIG. 10E, in one or more embodiments, the method further includes forming a first spacer 310 and a second spacer 320 by etching the inorganic layer 300 after (or in response to) the forming the inorganic layer 300 on the first conductive layer 139 and the second conductive layer 141.

When the inorganic layer 300 arranged on the first conductive layer 139 and the second conductive layer 141 is etched by a dry etching process, the inorganic layer 300 located at the first sidewall 139a of the first conductive layer 139 having a relatively steep slope may remain to form the first spacer 310, and the inorganic layer 300 located at the fourth sidewall 141b of the second conductive layer 141 may remain to form the second spacer 320. In one or more embodiments, the first spacer 310 may be in contact (e.g., direct contact) with the first sidewall 139a of the first conductive layer 139, and the second spacer 320 may be in contact (e.g., direct contact) with the fourth sidewall 141b of the second conductive layer 141. The inorganic layer 300 located on the second sidewall 139b of the first conductive layer 139 and the inorganic layer 300 located on the third sidewall 141a of the second conductive layer 141 may be removed.

The first spacer 310 and the second spacer 320 formed by dry-etching the inorganic layer 300 arranged on the first conductive layer 139 and the second conductive layer 141 may be arranged at the boundary between the pixel area PA and the transmission area TA and extend to the pixel area PA and the transmission area TA. The first conductive layer 139, the second conductive layer 141, the first spacer 310, and the second spacer 320 may be located on the same layer.

Figure 10F:
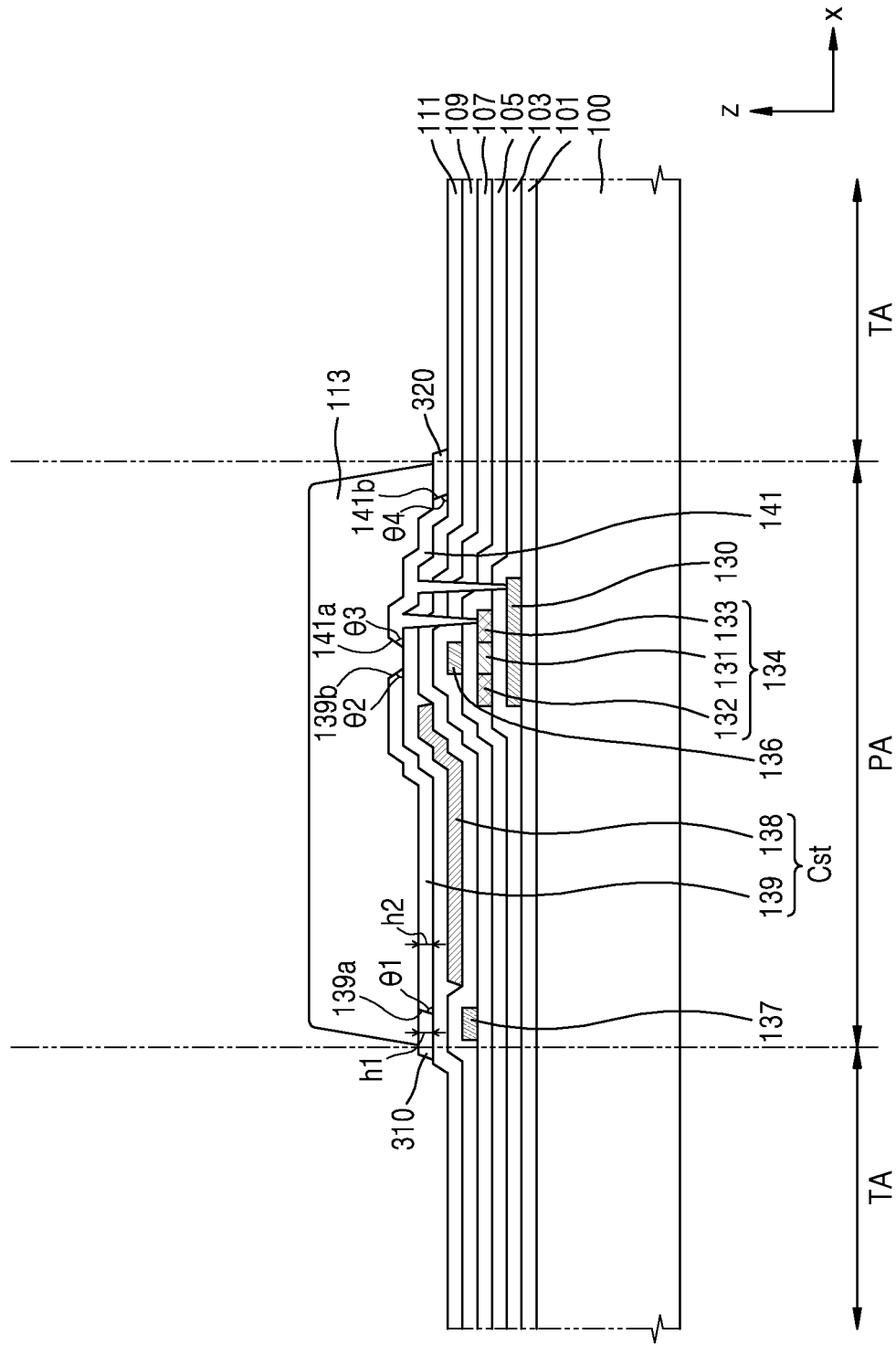

Referring to FIG. 10F, in one or more embodiments, the method further includes forming a first planarization layer 113 on the first conductive layer 139 after (or in response to) the forming the first spacer 310 and the second spacer 320. The first planarization layer 113 may be located within the first spacer 310 and the second spacer 320 in the cross-sectional view. That is, the ends of the first planarization layer 113 arranged on the first conductive layer 139 and the second conductive layer 141 may be located on the first spacer 310 and the second spacer 320, and thus, the first planarization layer 113 may not be arranged beyond the first spacer 310 and the second spacer 320, but may be arranged only within the first spacer 310 and the second spacer 320. In one or more embodiments, the first spacer 310 and the second spacer 320 extend beyond the first planarization layer 113 in the −x-direction and x-direction respectively. For example, in one or more embodiments, the first planarization layer 113 may be within adjacent boundaries between the pixel area PA and the transmission area TA in contrast to the first spacer 310 and the second spacer 320 that each extend from the boundary between the pixel area PA and the transmission area TA to the pixel area PA and the transmission area TA.

Because a plurality of planarization layers are arranged in the pixel area PA and a plurality of planarization layers are not arranged in the transmission area TA, the pixel area PA may have a first transmittance and the transmission area TA may have a second transmittance higher than the first transmittance.

When the size of a transmission area is increased to improve the transmittance of a display device, an organic material forming a planarization layer in a pixel area may be lost due to a difference in height between layers arranged on the pixel area and the transmission area.

According to the one or more embodiment of the present disclosure, the property that an inorganic layer on a sidewall having a relatively large inclination angle is not removed during a dry etching process and remains is used, and the loss of the organic material may be prevented or reduced by increasing the inclination angle of a sidewall of a conductive layer close to a transmission area to be relatively large and arranging, without an additional mask, a spacer at the boundary between the pixel area and the transmission area and extending to the pixel area and the transmission area. In addition, by forming a planarization layer with the spacer, which is at the boundary between the pixel area and the transmission area and extends to the pixel area and the transmission area, as an alignment point, an organic material forming the planarization layer may be prevented or substantially prevented from overflowing to the transmission area.

According to the one or more embodiments of the present disclosure, a display device that prevents or reduces the loss of the organic material and has high transmittance may be implemented. However, the scope of the present disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that various changes in form and details may be made therein without departing from the spirit and scope as defined by the following claims, and equivalents thereof.

What is claimed is:

1. A display device comprising:
    a substrate comprising a pixel area and a transmission area, the pixel area with an emission layer therein, the emission layer being to emit light;
    a plurality of insulating layers in the pixel area and the transmission area;
    a first conductive layer on the plurality of insulating layers in the pixel area, the first conductive layer comprising a first sidewall having a first inclination angle and a second sidewall having a second inclination angle different from the first inclination angle;
    a first spacer located on a same layer as the first conductive layer, the first spacer being at a boundary between the pixel area and the transmission area and extending to the pixel area and the transmission area; and
    a first planarization layer on the first conductive layer,
    wherein the first inclination angle is greater than the second inclination angle;
    wherein the first sidewall and the second sidewall are opposite and lateral ends of the first conductive layer;
    wherein the first spacer does not overlap the emission layer in a thickness direction of the display device; and
    wherein the first spacer comprises an inorganic insulating material.

2. The display device of claim 1, wherein the first inclination angle is 70 degrees or more and 90 degrees or less, and the second inclination angle is less than 70 degrees.

3. The display device of claim 1, wherein the first spacer is in direct contact with the first sidewall of the first conductive layer.

4. The display device of claim 1, further comprising:
    a second conductive layer on the plurality of insulating layers of the pixel area, the second conductive layer comprising a third sidewall having a third inclination angle and a fourth sidewall having a fourth inclination angle different from the third inclination angle.

5. The display device of claim 4, wherein the third inclination angle is less than 70 degrees, and the fourth inclination angle is 70 degrees or more and 90 degrees or less.

6. The display device of claim 4, further comprising:
    a second spacer located on a same layer as the second conductive layer, the second spacer being at a boundary between the pixel area and the transmission area and extending to the pixel area and the transmission area.

7. The display device of claim 6, wherein the second spacer is in direct contact with the fourth sidewall of the second conductive layer.

8. The display device of claim 6, wherein the first spacer and the second spacer are on a same layer.

9. The display device of claim 6, wherein, in a cross-sectional view, the first planarization layer does not extend beyond the first spacer and the second spacer into the transmission area.

10. The display device of claim 1, wherein the plurality of insulating layers comprise a first insulating layer on the substrate, a second insulating layer on the first insulating layer, a third insulating layer on the second insulating layer, a fourth insulating layer on the third insulating layer, and a fifth insulating layer on the fourth insulating layer.

11. The display device of claim 10, wherein the first spacer has a first height from a top surface of the fifth insulating layer and the first conductive layer has a second height from the top surface of the fifth insulating layer, wherein the first height and the second height are substantially equal to each other.

12. The display device of claim 1, further comprising:
    a second planarization layer on the first planarization layer;
    a pixel electrode on the second planarization layer;
    a pixel-defining layer on the pixel electrode to expose at least a portion of the pixel electrode;
    an intermediate layer on the pixel electrode, the intermediate layer comprising the emission layer; and
    an opposite electrode on the intermediate layer.

13. The display device of claim 12, wherein at least a portion of the opposite electrode extends to the transmission area.

14. The display device of claim 1, wherein the pixel area has a first transmittance, and
    wherein the transmission area has a second transmittance greater than the first transmittance.

15. A method of manufacturing a display device, the method comprising:
    preparing a substrate comprising a pixel area and a transmission area;
    forming a plurality of insulating layers in the pixel area and the transmission area;
    forming a first conductive layer and a second conductive layer on the plurality of insulating layers of the pixel area, the first conductive layer comprising a first sidewall having a first inclination angle and a second sidewall having a second inclination angle different from the first inclination angle, and the second conductive layer comprising a third sidewall having a third inclination angle and a fourth sidewall having a fourth inclination angle different from the third inclination angle;
    forming an inorganic insulating layer on the first conductive layer and the second conductive layer; and
    forming a first spacer and a second spacer by etching the inorganic insulating layer,
    forming an emission layer to emit light on the first conductive layer, wherein the emission layer does not overlap the first spacer in a thickness direction of the display device;
    wherein the first inclination angle is greater than the second inclination angle;
    wherein the first sidewall and the second sidewall are opposite and lateral ends of the first conductive layer; and wherein the first spacer and the first conductive layer are located on a same layer, and the second spacer and the second conductive layer are located on a same layer.

16. The method of claim 15, wherein the first conductive layer, the second conductive layer, the first spacer, and the second spacer are located on a same layer.

17. The method of claim 16, wherein the first spacer is in direct contact with the first sidewall of the first conductive layer, and
wherein the second spacer is in direct contact with the fourth sidewall of the second conductive layer.

18. The method of claim 15, wherein the first inclination angle and the fourth inclination angle are 70 degrees or more and 90 degrees or less, and the second inclination angle and the third inclination angle are less than 70 degrees.

19. The method of claim 15, wherein each of the first spacer and the second spacer is arranged at a boundary between the pixel area and the transmission area and extends to the pixel area and the transmission area.

20. The method of claim 15, further comprising:
after the forming the first spacer and the second spacer, forming a first planarization layer on the first conductive layer,
wherein, in a cross-sectional view, the first planarization layer does not extend beyond the first spacer and the second spacer into the transmission area.

\* \* \* \* \*